(12) United States Patent
Cha et al.

(10) Patent No.: US 10,826,026 B2
(45) Date of Patent: Nov. 3, 2020

(54) DISPLAY DEVICE AND MANUFACTURING METHOD THEREOF

(71) Applicant: Samsung Display Co., Ltd., Yongin-si (KR)

(72) Inventors: Myoung Geun Cha, Seoul (KR); Sang Gun Choi, Suwon-si (KR); Joon Woo Bae, Hwaseong-si (KR); Ji Yeong Shin, Busan (KR); Yong Su Lee, Seoul (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 16/203,784

(22) Filed: Nov. 29, 2018

(65) Prior Publication Data

US 2019/0326560 A1    Oct. 24, 2019

(30) Foreign Application Priority Data

Apr. 23, 2018  (KR) .................. 10-2018-0046800

(51) Int. Cl.
*H01L 51/56* (2006.01)
*H01L 27/32* (2006.01)
(Continued)

(52) U.S. Cl.
CPC ............ *H01L 51/56* (2013.01); *H01L 21/308* (2013.01); *H01L 27/3246* (2013.01);
(Continued)

(58) Field of Classification Search
None
See application file for complete search history.

(56) References Cited

U.S. PATENT DOCUMENTS 9,530,800 B2   12/2016  Wang et al.
9,543,370 B2 *  1/2017  Tsai .................... H01L 27/3276
(Continued)

FOREIGN PATENT DOCUMENTS

KR   10-2003-0096562 A   10/2003
KR   10-2016-0008680 A    1/2016
(Continued)

*Primary Examiner* — Shaun M Campbell
(74) *Attorney, Agent, or Firm* — Kile Park Reed & Houtteman PLLC

(57) ABSTRACT

A method for manufacturing a display device including forming a lower electrode on a substrate; depositing a first insulation layer thereon; forming a semiconductor layer that overlaps the lower electrode thereon; depositing a second insulation layer thereon; forming a gate electrode and an etching prevention layer that overlap the semiconductor layer thereon; depositing a third insulation layer thereon; forming a first conductor that overlaps the gate electrode thereon; depositing a fourth insulation layer thereon; forming a photosensitive film patterns thereon by depositing a photosensitive film and exposing and developing the photosensitive film such that portions of the photosensitive film are removed in a first area, a second area, and a third area; etching the third insulation layer using the patterns as an etching mask; etching the etching prevention layer by using the patterns as an etching mask; and etching the first insulation layer using the patterns as an etching mask.

21 Claims, 17 Drawing Sheets

(51) Int. Cl.
*H01L 21/308* (2006.01)
*H01L 51/52* (2006.01)

(52) U.S. Cl.
CPC ...... *H01L 27/3272* (2013.01); *H01L 27/3276* (2013.01); *H01L 51/5237* (2013.01)

(56) References Cited

U.S. PATENT DOCUMENTS

| | | | |
|---|---|---|---|
| 10,170,502 B2* | 1/2019 | Jeong | H01L 27/1288 |
| 10,446,591 B2* | 10/2019 | Kwon | H01L 27/1255 |
| 2006/0091399 A1* | 5/2006 | Lee | H01L 27/12 |
| | | | 257/72 |
| 2012/0168755 A1* | 7/2012 | Choi | H01L 27/124 |
| | | | 257/59 |
| 2016/0071891 A1* | 3/2016 | Oh | H01L 27/1248 |
| | | | 257/72 |
| 2018/0277614 A1* | 9/2018 | Ono | H01L 27/1222 |

FOREIGN PATENT DOCUMENTS

| | | | |
|---|---|---|---|
| KR | 10-2016-0092826 A | 8/2016 | |
| KR | 10-2017-0026009 A | 3/2017 | |

\* cited by examiner

DISPLAY DEVICE AND MANUFACTURING METHOD THEREOF

CROSS-REFERENCE TO RELATED APPLICATION

Korean Patent Application No. 10-2018-0046800 filed on Apr. 23, 2018, in the Korean Intellectual Property Office, and entitled: "Display Device and Manufacturing Method Thereof," is incorporated by reference herein in its entirety.

BACKGROUND

1. Field

Embodiments relate to a display device and a manufacturing method thereof.

2. Description of the Related Art

A display device is a device displaying an image, and recently, an organic light emitting diode display has received attention.

The organic light emitting diode display has a self-emission characteristic and does not require a separate light source, unlike a liquid crystal display device, it is possible to reduce thickness and weight thereof. Further, the organic light emitting diode display has high-quality characteristics such as low power consumption, high luminance, and a high response speed.

The above information disclosed in this Background section is only for enhancement of understanding of the background of the invention and therefore it may contain information that does not form the prior art that is already known in this country to a person of ordinary skill in the art.

SUMMARY

The embodiments may be realized by providing a display device including a substrate; a lower electrode on the substrate; a semiconductor layer on the lower electrode; a gate electrode and an etching prevention layer that overlap the semiconductor layer; a first conductor on the gate electrode; a second conductor on the first conductor; a light emission element that is electrically connected with the second conductor; and a first insulation layer between the semiconductor layer and the gate electrode and between the semiconductor layer and the etching prevention layer, wherein the first insulation layer includes a first sub-contact hole that overlaps the semiconductor layer, and the etching prevention layer includes a hole that is vertically aligned with the first sub-contact hole.

The display device may further include a second insulation layer between the gate electrode and the etching prevention layer, and between the gate electrode and the second conductor, the second insulation layer including a second sub-contact hole that overlaps the semiconductor layer, wherein the hole of the etching prevention layer is vertically aligned with the second sub-contact hole of the second insulation layer.

The display device may further include a third insulation layer between the first conductor and the second conductor; and a fourth insulation layer between the lower electrode and the semiconductor layer, wherein the third insulation layer includes a second contact hole that overlaps the first conductor, and the first insulation layer, the second insulation layer, the third insulation layer, and the fourth insulation layer collectively include a third contact hole that overlaps the lower electrode.

The lower electrode and the semiconductor layer may be electrically connected with each other.

The hole in the etching prevention layer may have a width that is larger than a width of the first sub-contact hole of the first insulation layer.

The display device may further include a second insulation layer between the gate electrode and the etching prevention layer, and between the gate electrode and the second conductor, the second insulation layer including a second sub-contact hole that overlaps the semiconductor layer, wherein the hole in the etching prevention layer is vertically aligned with the second sub-contact hole of the second insulation layer, and the width of the hole in the etching prevention layer is larger than a width of the second sub-contact hole of the second insulation layer.

The display device may further include a third insulation layer between the first conductor and the second conductor; and a fourth insulation layer between the lower electrode and the semiconductor layer, wherein the third insulation layer includes a second contact hole that overlaps the first conductor, and the first insulation layer, the second insulation layer, the third insulation layer, and the fourth insulation layer collectively include a third contact hole that overlaps the lower electrode.

The lower electrode and the semiconductor layer may be electrically connected with each other.

The embodiments may be realized by providing a display device including a substrate; a lower electrode on the substrate; a first insulation layer on the lower electrode; a semiconductor layer on the first insulation layer, the semiconductor layer overlapping the lower electrode; a second insulation layer on the semiconductor layer; a gate electrode and an etching prevention layer on the second insulation layer, the gate electrode and the etching prevention layer overlapping the semiconductor layer; a third insulation layer on the gate electrode and the etching prevention layer; a first conductor on the third insulation layer, the first conductor overlapping the gate electrode; a fourth insulation layer on the first conductor; a signal transmitting layer on the fourth insulation layer, the signal transmitting layer overlapping the first conductor; a connection member on the fourth insulation layer, the connection member overlapping the lower electrode and the semiconductor layer; a fifth insulation layer on the signal transmitting layer and the connection member; and a light emission element on the fifth insulation layer, wherein the fourth insulation layer includes a first contact hole that overlaps the first conductor, the second insulation layer, the third insulation layer, and the fourth insulation layer include a second contact hole that overlaps the semiconductor layer, the etching prevention layer includes a hole that is vertically aligned with the second contact hole, and the first insulation layer, the second insulation layer, the third insulation layer, and the fourth insulation layer include a third contact hole that overlaps the lower electrode.

The signal transmitting layer may be on the first contact hole and is connected with the first conductor, the connection member may be on the second contact hole and the third contact hole, and the semiconductor layer and the lower electrode may be connected with each other through the connection member.

The embodiments may be realized by providing a method for manufacturing a display device, the method including forming a lower electrode on a substrate; depositing a first insulation layer on the lower electrode; forming a semiconductor layer that overlaps the lower electrode on the first insulation layer; depositing a second insulation layer on the semiconductor layer; forming a gate electrode and an etching prevention layer that overlap the semiconductor layer on the second insulation layer; depositing a third insulation layer on the gate electrode and the etching prevention layer; forming a first conductor that overlaps the gate electrode on the third insulation layer; depositing a fourth insulation layer on the first conductor; forming a photosensitive film patterns on the fourth insulation layer by depositing a photosensitive film and exposing and developing the photosensitive film such that portions of the photosensitive film are removed in a first area, a second area, and a third area; primary etching the third insulation layer by using the photosensitive film patterns as an etching mask; secondary etching the etching prevention layer by using the photosensitive film patterns as an etching mask; and tertiary etching the first insulation layer by using the photosensitive film patterns as an etching mask.

The first area may be an area that overlaps the first conductor, the second area may be an area that overlaps the semiconductor layer, and the third area may be an area that overlaps the lower electrode.

In the primary etching, the third insulation layer in the first area may be etched and a first contact hole is formed, the fourth insulation layer and the third insulation layer that are in the second area may be etched and a first sub-contact hole is formed, and the fourth insulation layer, the third insulation layer, and the second insulation layer that are in the third area may be etched.

In the secondary etching, a hole may be formed in the etching prevention layer, and the hole of the etching prevention layer may be vertically aligned with the fourth insulation layer and the first sub-contact hole of the third insulation layer that are in the second area.

In the secondary etching, the first insulation layer in the third area may be partially etched and a groove is formed in the first insulation layer.

In the tertiary etching, the second insulation layer that is in the second area may be etched and a second sub-contact hole is formed, and a second contact hole formed of the first sub-contact hole and the second sub-contact hole is formed, and the first insulation layer that is in the third area is etched and a third contact hole is formed.

The second sub-contact hole may be vertically aligned with the hole in the etching prevention layer.

The method may further include forming a signal transmitting layer on the first contact hole, and forming a connection member on the second contact hole and the third contact hole.

In the tertiary etching, the etching prevention layer may be partially etched and the hole of the etching prevention layer may be widened.

The method may further include forming a signal transmitting layer on the first contact hole, and forming a connection member on the second contact hole and the third contact hole.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
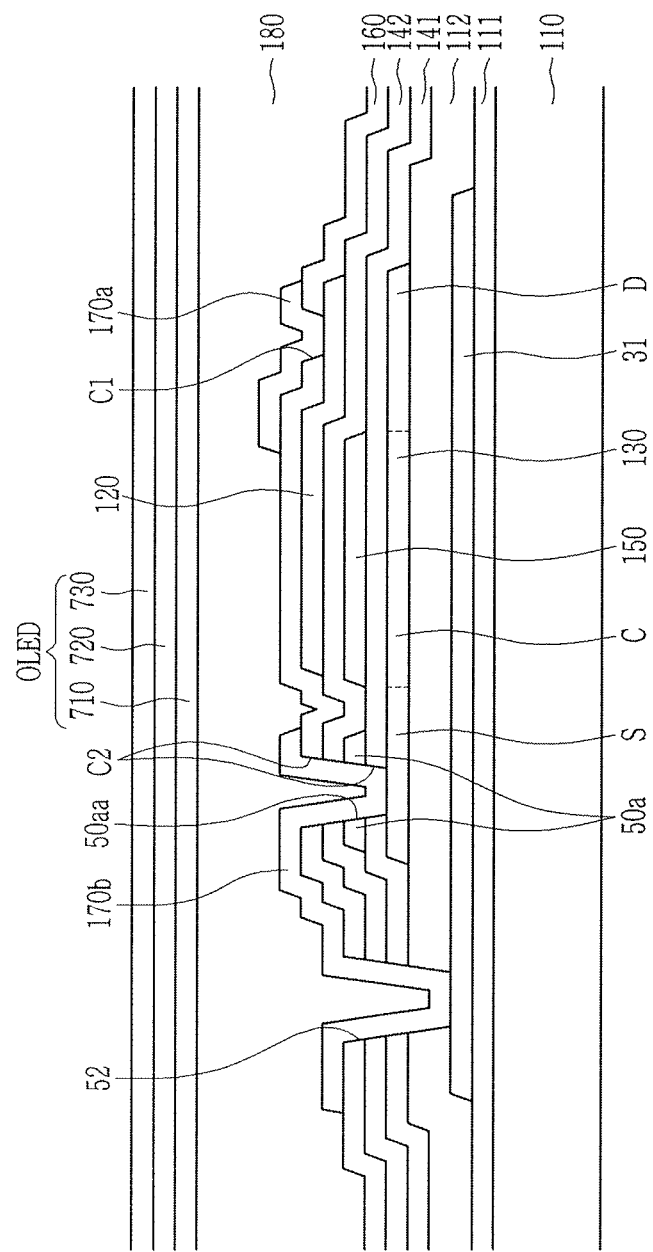
FIG. 1 illustrates a cross-sectional view of a part of a display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. In addition, it will also be understood that when a layer is referred to as being "between" two layers, it can be the only layer between the two layers, or one or more intervening layers may also be present. Like reference numerals refer to like elements throughout.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

In addition, unless explicitly described to the contrary, the word "comprise" and variations such as "comprises," "includes," "including," or "comprising" will be understood to imply the inclusion of stated elements but not the exclusion of any other elements.

In addition, in this specification, the phrase "on a plane" means viewing a target portion from the top, and the phrase "on a cross-section" means viewing a cross-section formed by vertically cutting a target portion from the side.

First, referring to FIG. 1, a part of a display device according to an exemplary embodiment will be described. FIG. 1 illustrates a cross-sectional view of a part of the display device according to the exemplary embodiment.

The display device according to the present exemplary embodiment may include a substrate 110, a barrier layer 111 on the substrate 110, and a lower electrode 31 on the barrier layer 111. The lower electrode 31 may be formed of a conductive metal or a semiconductor material having a conductive characteristic.

A buffer layer 112 may be on the lower electrode 31. The barrier layer 111 and the buffer layer 112 may include, e.g., an inorganic insulation material such as a silicon oxide, a silicon nitride, an aluminum oxide, and the like, and an organic insulation material such as a polyimide acryl (epoxy added) and the like.

A semiconductor layer 130 that includes a channel C, a first electrode S, and a second electrode D may be on the buffer layer 112.

A first gate insulation layer 141 may be on the semiconductor layer 130.

A first gate conductor (that includes a gate electrode 150 of a transistor and an etching prevention layer 50a) may be on the first gate insulation layer 141, and a second gate insulation layer 142 may be on the first gate conductor. The first gate insulation layer 141 and second gate insulation layer 142 may be made of, e.g., a silicon nitride, a silicon oxide, an aluminum oxide, and the like.

A second gate conductor (that includes a sustain electrode 120) may be on the second gate insulation layer 142.

An interlayer insulation layer 160 may be on the second gate conductor. The interlayer insulation layer 160 may be made of, e.g., a silicon nitride, a silicon oxide, an aluminum oxide, and the like, or may be made of an organic insulation material.

A data conductor (that includes a signal transmitting layer 170a and a connection member 170b) may be on the interlayer insulation layer 160.

A passivation layer 180 may be on the data conductor. The passivation layer 180, which may be referred to as a planarization layer, may include an organic insulation material.

An organic light emitting diode OLED (that includes a pixel electrode 710, an organic emission layer 720, and a common electrode 730) may be on the passivation layer 180. The organic light emitting diode OLED may also be referred to as a light emission element. In an implementation, a barrier rib may be between the pixel electrode and the common electrode.

The interlayer insulation layer 160 may include a first contact hole C1 that overlaps or overlies the sustain electrode 120 along a vertical direction. The interlayer insulation layer 160, the second gate insulation layer 142, and the first gate insulation layer 141 may include a second contact hole C2 that overlaps the first electrode S of the semiconductor layer 130 along the vertical direction. The interlayer insulation layer 160, the second gate insulation layer 142, the first gate insulation layer 141, and the buffer layer 112 may include a third contact hole 52 that overlaps the lower electrode 31 along the vertical direction.

The sustain electrode 120 may be connected with the signal transmitting layer 170a through the first contact hole C1. The signal transmitting layer 170a may be a driving voltage line.

The first electrode S of the semiconductor layer 130 that overlaps the second contact hole C2 and the lower electrode 31 that overlaps the third contact hole 52 may be connected with each other through the connection member 170b.

The etching prevention layer 50a of the display device according to the present exemplary embodiment may be on the first electrode S of the semiconductor layer 130, which overlaps the second contact hole C2, and may include a hole 50aa that is vertically aligned with (e.g., a part of) the second contact hole C2 in the second gate insulation layer 142 and the second contact hole C2 formed in the first gate insulation layer 141. For example, the etching prevention layer 50a may form a part of the first contact hole C1 (along with, e.g., the interlayer insulation layer 160), and may help prevent etching of the semiconductor layer 130 by covering the same while the second contact hole C2 is formed in the interlayer insulation layer 160 and the second gate insulation layer 142.

A method for manufacturing the display device will be described in detail below.

Figure 2:
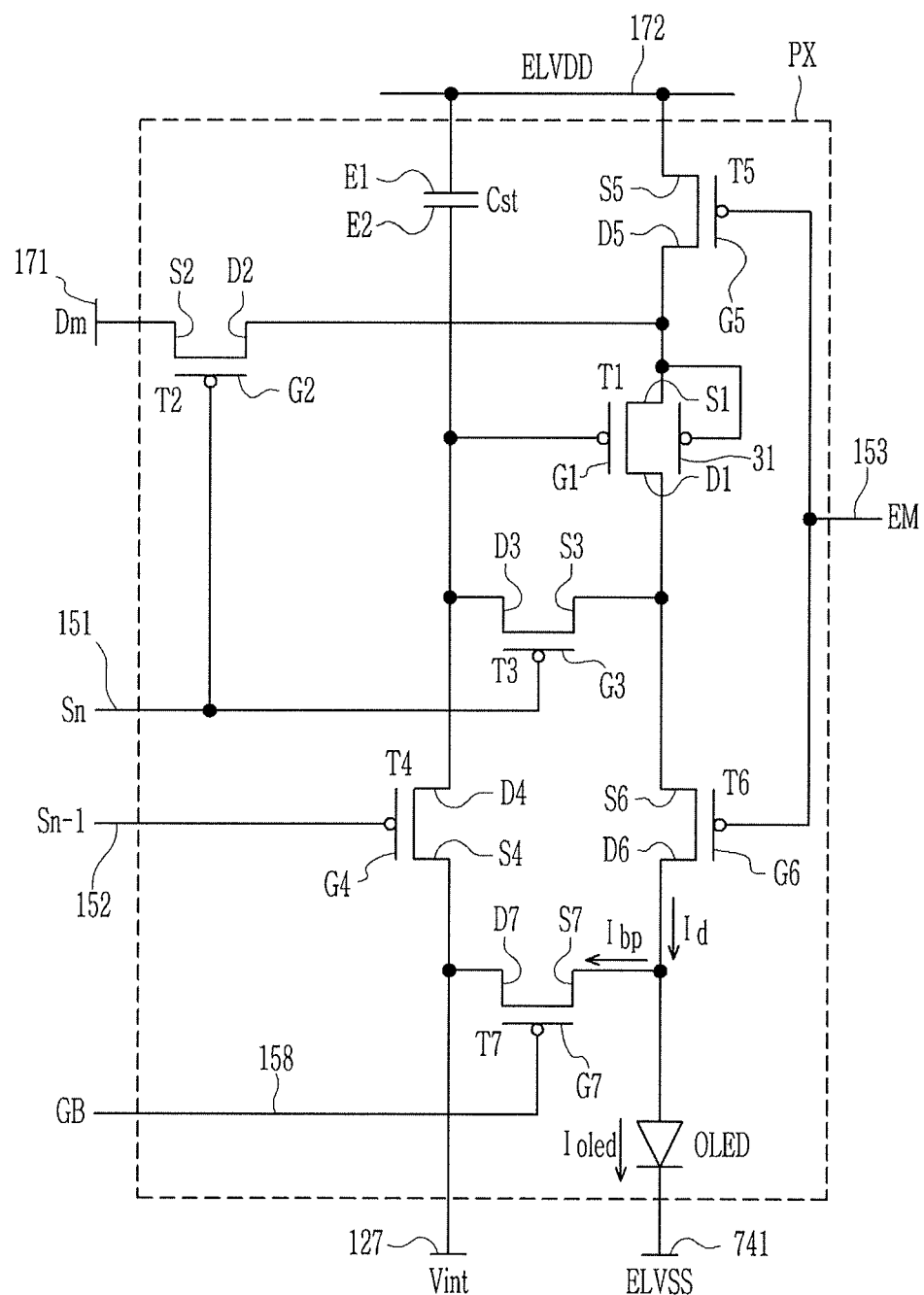
FIG. 2 illustrates an equivalent circuit diagram of a pixel of the display device according to the exemplary embodiment.
Figure 3:
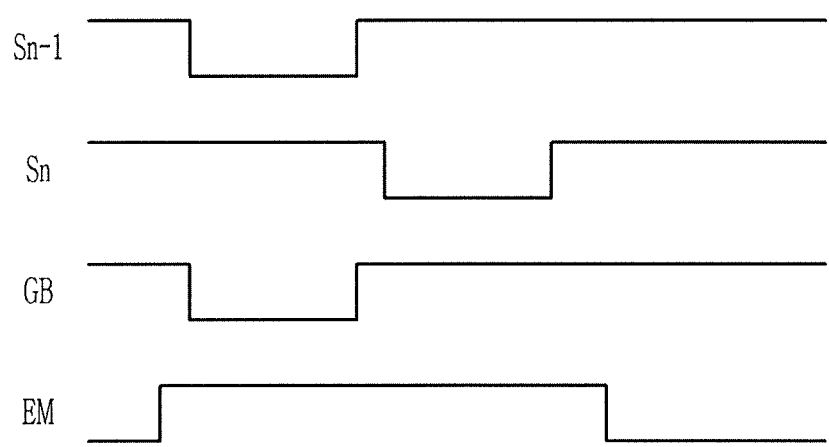
FIG. 3 illustrates a timing diagram of a signal applied to the pixel of the display device according to the exemplary embodiment.

Referring to FIG. 2 and FIG. 3, operation of a pixel of the display device according to the present exemplary embodiment will be described. FIG. 2 illustrates an equivalent circuit diagram of a pixel of the display device according to the present exemplary embodiment, and FIG. 3 illustrates a timing diagram of a pixel applied to the pixel of the display device according to the exemplary embodiment.

Referring to FIG. 2, a pixel PX of the display device according to the exemplary embodiment may include a plurality of signal lines 127, 151, 152, 153, 158, 171, 172, and 741, a plurality of transistors T1, T2, T3, T4, T5, T6, and T7 that are connected to the plurality of signal lines, a storage capacitor Cst, and an organic light emitting diode OLED.

The plurality of transistors T1, T2, T3, T4, T5, T6, and T7 may include a first transistor T1, which is a driving transistor, a second transistor T2 and a third transistor, which are switching transistors, a fourth transistor T4, a fifth transistor T5, a sixth transistor T6, and a seventh transistor T7, which are compensation transistors required for operation of the organic light emitting diode OLED. In an implementation, the third transistor T3 may be a compensation transistor, the fourth transistor T4 may be an initialization transistor, the fifth transistor T5 may be an operation control transistor T5, the sixth transistor T6 may be a light emission control transistor, and the seventh transistor T7 may be a bypass transistor.

The plurality of signal lines 127, 151, 152, 153, 158, 171, 172, and 741 may include a scan line 151, a previous scan line 152, a light emission control line 153, a bypass control line 158, a data line 171, a driving voltage line 172, an initialization voltage line 127, and a common voltage line 741. The bypass control line 158 may be a part of the previous scan line 152, or may be electrically connected to the previous scan line 152.

The scan line 151 may be connected to a gate driver, and transmits a scan signal Sn to the second transistor T2 and the third transistor T3. The previous scan line 152 may be connected to the gate driver and transmits a previous scan signal Sn−1 transmitted to a pixel disposed at a previous stage to the fourth transistor T4. The light emission control line 153 may be connected to a light emission control portion, and transmits a light emission control signal EM that controls light emission duration of the organic light emitting diode OLED to the fifth transistor T5 and the sixth transistor T6. The bypass control line 158 transmits a bypass signal GB to the seventh transistor T7.

The data line 171 transmits a data voltage Dm generated by a data driver (not shown), the driving voltage line 172 transmits a driving voltage ELVDD, the initialization voltage line 127 transmits an initialization voltage Vint for initialization of the first transistor T1, and the common voltage line 741 transmits a common voltage Vcom. The driving voltage line 172, initialization voltage line 127, and common voltage line 741 may be applied with voltages, each having a constant magnitude.

A gate electrode G1 of the first transistor T1, which is a driving transistor, may be connected to a second sustain electrode E2 of the storage capacitor Cst, the first electrode S1 of the first transistor T1 may be connected with the driving voltage line 172 via the fifth transistor T5, the first electrode S1 of the first transistor T1 may also be connected with a second electrode D2 of the second transistor T2, and the second electrode D2 of the first transistor T1 may be electrically connected with an anode of the organic light emitting diode OLED via the sixth transistor T6. The lower electrode 31 may be connected to the first electrode S1 of the first transistor T1 and thus may serve as an additional gate electrode of the first transistor T1. The first transistor T1 receives a data voltage Dm according to switching operation of the second transistor T2, and supplies a driving current Id to the organic light emitting diode OLED.

A gate electrode G2 of the second transistor T2 may be connected with the scan line 151, a first electrode S2 of the second transistor T2 is connected with the data line 171, and a second electrode D2 of the second transistor T2 is connected with the first electrode S1 of the first transistor T1. The second transistor T2 may be turned on according to a scan signal Sn transmitted through the scan line 151, and transmits a data voltage Dm transmitted through the data line 171 to the first electrode S1 of the first transistor T1.

A gate electrode G3 of the third transistor T3 may be connected to the scan line 151, a first electrode S3 of the third transistor T2 is connected with the second electrode D2 of the first transistor T1, and a second electrode D3 of the third transistor T3 may be connected with a second sustain electrode E2 of the storage capacitor Cst, the gate electrode G1 of the first transistor T1, and a second electrode D4 of the fourth transistor T4. The third transistor T3 may be turned on according to the scan signal Sn transmitted through the scan line 151, connects the gate electrode G1 and the second electrode D1 of the first transistor T1, and connects the second electrode D1 of the first transistor T1 and the second sustain electrode E2 of the storage capacitor Cst.

A gate electrode G4 of the fourth transistor T4 may be connected with the previous scan line 152, a first electrode S4 of the fourth transistor T2 is connected with the initialization voltage line 127, and the second electrode D4 of the fourth transistor T2 may be connected with the second sustain electrode E2 of the storage capacitor Cst and the gate electrode G1 of the first transistor T1 via the second electrode D3 of the third transistor T3. The fourth transistor T4 may be turned on according to the previous scan signal Sn−1 transmitted through the previous scan line 152, and performs an initialization operation to initialize a gate voltage of the gate electrode G1 of the first transistor T1 by transmitting an initialization voltage Vint to the gate electrode G1 of the first transistor T1. In addition, the fourth transistor T4 transmits the initialization voltage Vint to the second sustain electrode E2 of the storage capacitor Cst.

A gate electrode G5 of the fifth transistor T5 may be connected with the light emission control line 153, a first electrode S5 of the fifth transistor T5 is connected with the driving voltage line 172, and a second electrode D5 of the fifth transistor T5 may be connected to the first electrode S1 of the first transistor T1 and the second electrode D2 of the second transistor T2.

A gate electrode G6 of the sixth transistor T6 may be connected with the light emission control line 153, a first electrode S6 of the sixth transistor T6 is connected with the second electrode D1 of the first transistor T1 and the first electrode S3 of the third transistor T3, and a second electrode D6 of the sixth transistor T6 may be connected with the anode of the organic light emitting diode OLED.

The fifth transistor T5 and the sixth transistor T6 may be simultaneously turned on by a light emission control signal EM transmitted through the light emission control line 153, and when the driving voltage ELVDD is applied to the first electrode S1 of the first transistor T1 through the fifth transistor T5, the first transistor T1 outputs a driving current Id according to a voltage (i.e., a voltage of the second sustain electrode E2 of the storage capacitor Cst) of the gate electrode G1 of the first transistor T1. The output driving current Id may be transmitted to the organic light emitting diode OLED through the sixth transistor T6. A current Ioled flows to the organic light emitting diode OLED and thus the organic light emitting diode OLED emits light.

A gate electrode G7 of the seventh transistor T7 may be connected with the bypass control line 158, a first electrode S7 of the seventh transistor T7 is connected with the anode of the organic light emitting diode OLED, and a second electrode D7 of the seventh transistor T7 is connected with the initialization voltage line 127. The bypass control line 158 may be connected to the previous scan line 152, and a bypass signal GB supplied to the bypass control line 158 may have the same timing as the previous scan signal. The bypass control line 158 may transmit a signal that is different from the previous scan signal Sn−1 rather than being connected to the previous scan line 152. When the seventh transistor T7 is turned on by the bypass signal GB, the initialization voltage Vint is applied to the anode of the organic light emitting diode OLED for initialization.

The first sustain electrode E1 of the storage capacitor Cst may be connected with the driving voltage line 172, and the second sustain electrode E2 is connected with the gate electrode G1 of the first transistor T1, the second electrode D3 of the third transistor T3, and the second electrode D4 of the fourth transistor T4. The second sustain electrode E2 determines a voltage of the gate electrode G1 of the first transistor T1, and receives the data voltage Dm through the second electrode D3 of the third transistor T3 or receives the initialization voltage Vint through the second electrode D4 of the fourth transistor T4.

Meanwhile, the anode of the organic light emitting diode OLED may be connected with the second electrode D6 of the sixth transistor T6 and the first electrode S7 of the seventh transistor T7, and a cathode of the organic light emitting diode OLED is connected with the common voltage line 741 that transmits the common voltage ELVSS.

In an implementation, in the exemplary embodiment of FIG. 1, the pixel circuit may include, e.g., seven transistors T1, T2, T3, T4, T5, T6, and T7 one storage capacitor Cst. In an implementation number of transistors, the number of capacitors, and connection therebetween can be variously modified.

Operation of the pixel of the organic light emitting diode display according to the exemplary embodiment will be described with reference to FIG. 2 and FIG. 3.

As shown in FIG. 3, a low-level previous scan signal Sn−1 may be supplied through the previous scan line 152 during an initialization period. Then, the fourth transistor T4 may be turned on corresponding to the low-level previous scan signal Sn−1, and then the initialization voltage Vint of the initialization voltage line 127 may be connected to the gate electrode G1 of the first transistor T1 through the fourth transistor T4 and thus the first transistor T1 is initialized by the initialization voltage Vint.

In addition, during the initialization period, a low-level bypass signal GB may be applied to the seventh transistor T7. The seventh transistor T7 applied with the bypass signal GB is turned on and thus the initialization voltage Vint is applied to the anode of the organic light emitting diode OLED through the seventh transistor T7. As a result, the anode of the organic light emitting diode OLED is initialized.

Next, during a data writing period, a low-level scan signal Sn may be supplied through the scan line 151. Then, the second transistor T2 and the third transistor T3 are turned on corresponding to the low-level scan signal Sn. When the second transistor T2 is turned on, the data voltage Dm is passed through the second transistor T2 and then input to the first electrode S1 of the first transistor T1. When the third transistor T3 is turned on, the second electrode D2 of the first transistor T1 is electrically connected with the gate electrode G1 and the second sustain electrode E2 of the storage capacitor Cst, and since the gate electrode G1 and the second electrode D2 of the first transistor T1 are connected, they are diode-connected.

During the initialization period, the first transistor T1 may be in a turned-on state since the gate electrode G1 is applied with a low voltage (i.e., the initialization voltage Vint). Thus, the data voltage Dm input to the first electrode S1 of the first transistor T1 may be passed through a channel of the first transistor T1 and output to the second electrode D1, and then passed through the third transistor T3 and stored in the second sustain electrode E2 of the storage capacitor Cst.

A voltage applied to the second sustain electrode E2 may be changed depending on a threshold voltage Vth of the first transistor T1, and when the data voltage Dm is applied to the first electrode S1 of the first transistor T1 and the initialization voltage Vint is applied to the gate electrode G1 of the first transistor T1, a voltage output to the second electrode D1 may have a voltage of Vgs+Vth. Here, since Vgs corresponds to a difference between a voltage applied to the gate electrode G1 and the first electrode S1 of the first transistor T1, it may have a value of Dm−Vint. Therefore, a voltage output from the second electrode D1 and then stored in the second sustain electrode E2 may have a value of Dm−Vint+Vth.

Next, during the light emission period, the light emission control signal EM supplied from the light emission control line 153 may be changed from high level to low level. Then, during the light emission period, the fifth transistor T5 and the sixth transistor T6 are turned on by the low-level light emission control signal EM. Thus, a driving current Id may be generated according to a voltage difference between the gate voltage of the gate electrode G1 and the driving voltage ELVDD of the first electrode S1 of the first transistor T1, and the driving current Id is supplied to the organic light emitting diode OLED through the sixth transistor T6. The driving current Id of the first transistor T1 may have a value that is proportional to the square of Vgs−Vth. Here, Vgs may correspond to a voltage difference between opposite ends of the storage capacitor Cst and Vgs may have a value of (Vg−Vs), and thus Vgs has a value of (Dm−Vint+Vth−ELVDD). When a value of Vgs−Vth is acquired by subtracting Vth, a value of (Dm−Vint−ELVDD) is acquired. That is, the driving current Id of the first transistor T1 has an output current that is independent of the threshold voltage Vth of the first transistor T1.

Therefore, although the first transistors T1 at each pixel PX have a threshold voltage Vth that is different from one another due to process dispersion, the first transistors T1 can output a constant output current, thereby reducing non-uniformity of the characteristic of the transistor.

In the above equation, the value of Vth may be slightly greater than zero or a negative value when the transistor T1 is a P-type transistor using a polycrystalline semiconductor. In addition, depending on a voltage calculation direction, expressions of + and − may be change. However, the driving current Id, which is an output current of the driving transistor T1, can still have a value that is independent of the threshold voltage Vth.

When the above-described light emission period is terminated, the initialization period starts again such that the same operation is repeated.

In each of the plurality of transistors T1, T2, T3, T4, T5, T6, and T7, one of the first electrode and the second electrode may become a source electrode and the other may become a drain electrode depending on a voltage or current application direction.

Meanwhile, depending on exemplary embodiments, when the seventh transistor T7 initializes the anode of the organic light emitting diode OLED in the initialization period, even a small amount of current emitted under a condition that the driving transistor T1 is not actually turned on can be prevented from flowing toward the organic light emitting diode OLED. In this case, the small amount of current is output as a bypass current Ibp to a terminal of an initialization voltage Vint through the seventh transistor T7. Accordingly, the organic light emitting diode OLED can be prevented from emitting unnecessary light so that a black gray can be more vividly displayed and a contrast ratio can be improved. In such a case, the bypass signal GB may be a timing signal that is different from the previous can signal Sn−1. Depending on exemplary embodiments, the seventh transistor T7 may be omitted.

The lower electrode 31 may be connected to the first electrode S1 of the first transistor T1 and thus serves as an additional control electrode of the first transistor T1. The lower electrode 31 according to the present exemplary embodiment is connected with the first electrode S1 of the first transistor T1, but this is not restrictive. The lower electrode 31 may be connected to other transistors. As described, when a voltage of the first electrode S1 of the first transistor T1 is applied to the lower electrode 31, a current slope becomes less steep in a saturation area in a voltage-current characteristic graph of the first transistor T1 such that output saturation of the first transistor T1 can be improved.

Figure 4:
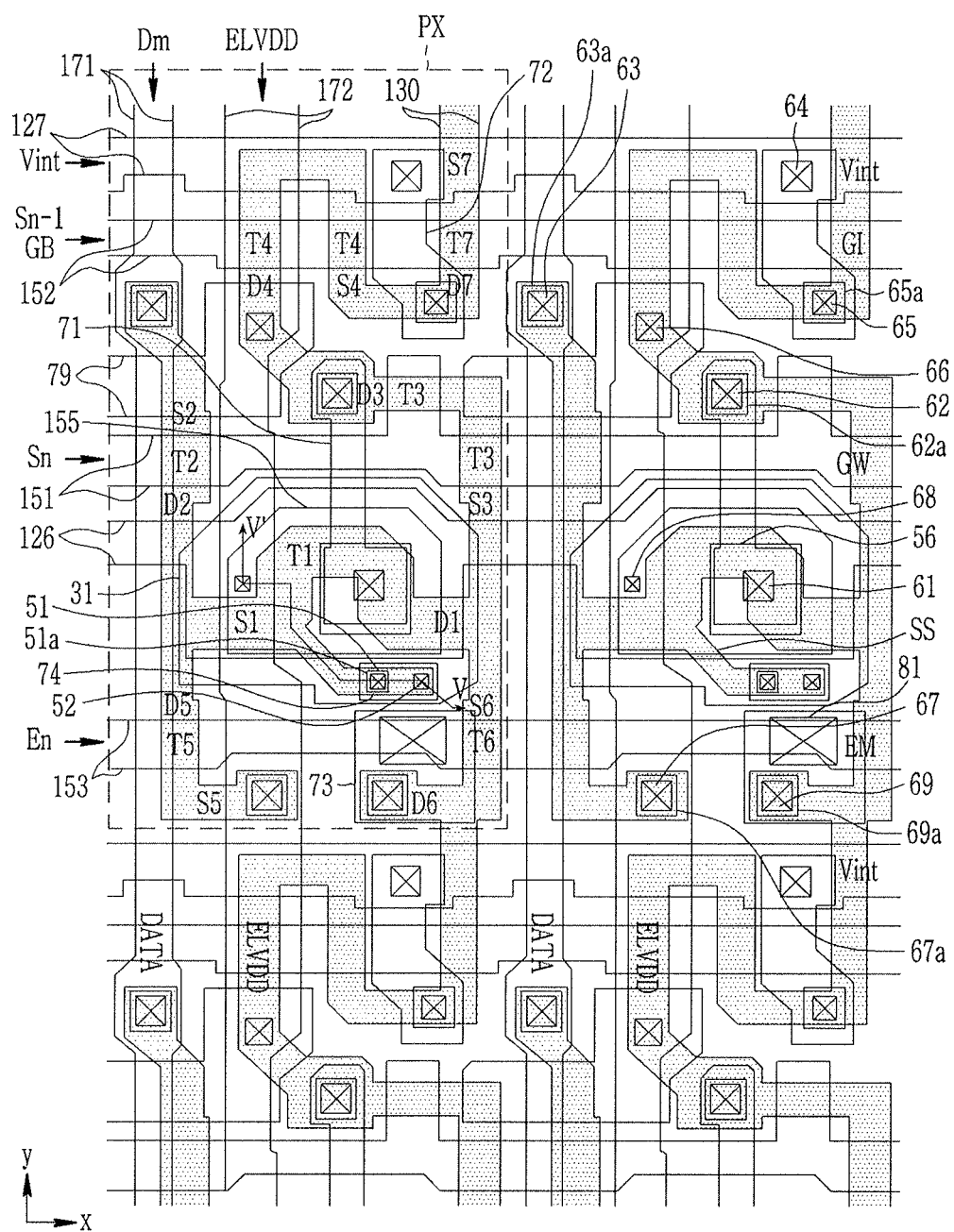
FIG. 4 illustrates a layout view of a pixel area of the display device according to the exemplary embodiment.
Figure 5:
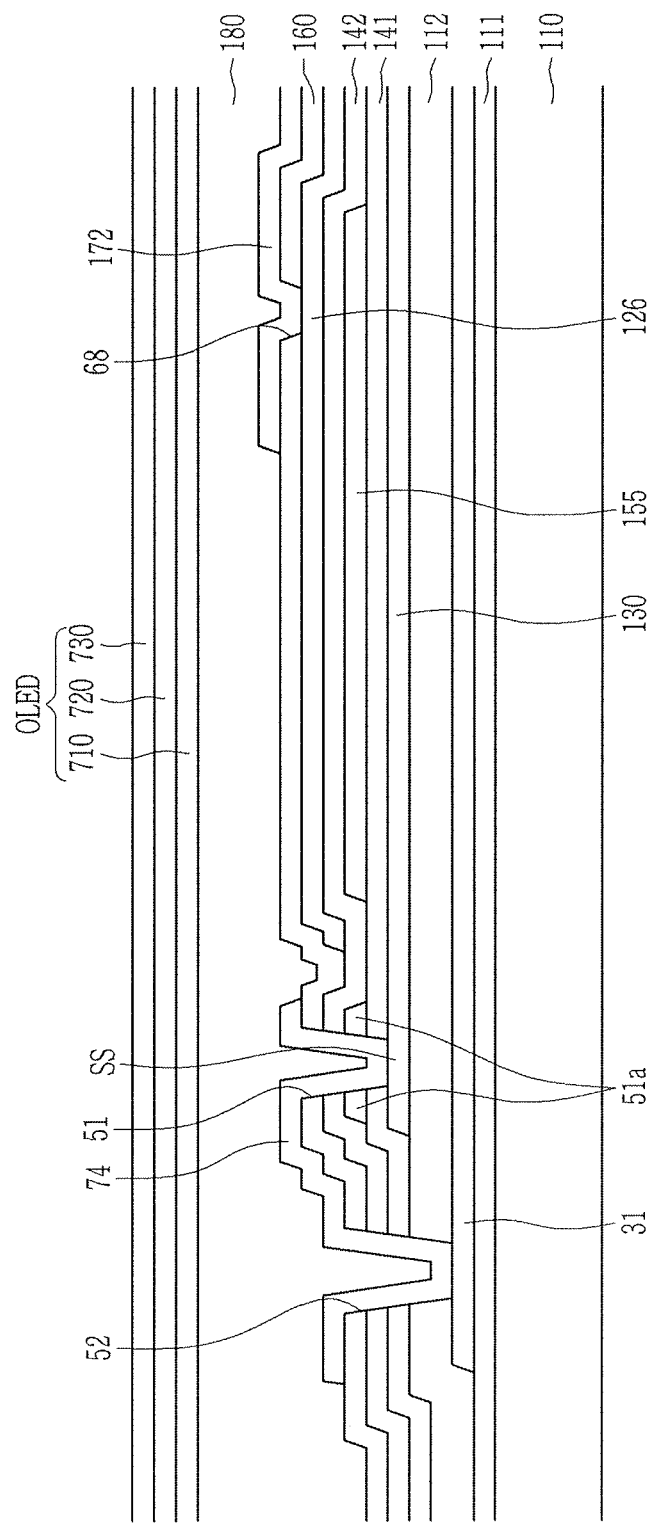
FIG. 5 illustrates a cross-sectional view of FIG. 4, taken along the line V-V'.

Referring to FIG. 4 and FIG. 5, a pixel structure of a pixel device according to an exemplary embodiment will be described in detail. FIG. 4 illustrates a layout view of a pixel area in a display device according to an exemplary embodiment, and FIG. 5 illustrates a cross-sectional view of FIG. 4, taken along the line V-V'.

Referring to FIG. 4, a display device according to an exemplary embodiment may include a scan line Sn, a previous scan line 152, a light emission control line 153, and an initialization voltage line 127 that substantially extend in a first direction (i.e., x-axis direction) and respectively transmit a scan signal Sn, a previous scan signal Sn−1, a light emission control signal EM, and an initialization voltage Vint. A bypass signal GB is transmitted through the previous scan line 152. An organic light emitting diode (OLED) display includes a data line and a driving voltage line 172 that extend in a second direction (i.e., y-axis direction) that crosses the first direction, and respectively transmit a data voltage Dm and a driving voltage ELVDD.

The organic light emitting diode display may include a first transistor T1, a second transistor T2, a third transistor T3, a fourth transistor T4, a fifth transistor T5, a sixth transistor T6, a seventh transistor T7, a storage capacitor Cst, and an organic light emitting diode OLED.

Referring to FIG. 5, together with FIG. 4, in the organic light emitting diode display according to the present exemplary embodiment, the barrier layer 111 may be on the substrate 110 (e.g., that is made of a flexible material such as polyimide (PI)). The barrier layer 111 may help a characteristic of a polycrystalline semiconductor by blocking an impurity from the substrate 110 during a crystallization process for forming the polycrystalline semiconductor, and may help reduce a stress applied to the substrate 110.

The lower electrode 31 may be on the barrier layer 111 and the buffer layer 112 may be on the lower electrode 31. The lower electrode 31 may overlap the first transistor T1 along the vertical direction.

In an implementation, the barrier layer 111 and the buffer layer 112 may include an inorganic insulation material such as a silicon oxide, a silicon nitride, an aluminum oxide, and the like, or may include an organic insulation material such as a polyimide acryl (epoxy added) and the like.

The semiconductor layer 130 (that includes channels), first electrodes S1, S2', S3, S4, S5, S6, and S7, and second electrodes D1, D2, D3, D4, D5, D6, and D7 of the plurality of transistors T1, T2, T3, T4, T5, T6, and T7 may be on the buffer layer 112. The semiconductor layer 130 may be bent into or formed having various shapes. The semiconductor layer 130 may have a bent shape, and a length of a channel of the semiconductor layer 130 may be extended. The semiconductor layer 130 may be formed of a polycrystalline semiconductor material or an oxide semiconductor material.

The first gate insulation layer 141 may be on the semiconductor layer 130, and the first gate conductor (that includes the gate electrode 155 which is a first sustain electrode E1, the scan line 151, the previous scan line 152, the light emission control line 153, and etching prevention layers 51a, 62a, 63a, 65a, and 69a) may be on the first gate insulation layer 141.

The channel of the first transistor T1 may be between the first electrode S1 and the second electrode DE and the first electrode S1 and the second electrode D1 of the first transistor T1 may be at opposite sides of the channel of the first transistor T1. The channel of the first transistor T1 may overlap the gate electrode 155. The first electrode S1 of the first transistor T1 may be connected with the second electrode D2 of the second transistor T2, and may be simultaneously connected with the second electrode D5 of the fifth transistor T5. The second electrode D1 of the first transistor T1 may be connected with the first electrode S3 of the third transistor T3, and may be simultaneously connected with the first electrode S1 of the sixth transistor T6.

The first electrode S2 and the second electrode D2 of the second transistor T2 may be at opposite sides of the channel of the second transistor T2. A gate electrode of the second transistor T2 may be a part of the scan line 151. The channel of the second transistor T2 partially overlaps the scan line 151, which is a gate electrode.

The first electrode S3 and the second electrode D3 of the third transistor T3 may be at opposite sides of the channel of the third transistor T3. A gate electrode of the third transistor T3 may be a part of the scan line 151 and a protrusion that protrudes from the scan line 151. The channel of the third transistor T3 overlaps a gate electrode of the third transistor T3. As described, the third transistor T3 may include two gate electrodes, and has a dual gate structure that includes a channel that is disposed at two places. A parasitic capacitor control pattern 79 may be between the two gate electrodes of the third transistor T3.

The first electrode S4 and the second electrode D4 of the fourth transistor T4 may be at opposite sides of the channel of the fourth transistor T4. A gate electrode of the fourth transistor T4 may be a part of the previous scan line 152. The previous scan line 152 may overlap the semiconductor layer 130 at two places, and the overlapped portions form channels of the fourth transistor T4. The fourth transistor T4 may include two gate electrodes, and may have a dual gate structure that includes a channel that is disposed at two places. The second electrode D2 of the third transistor T3 and the second electrode D4 of the fourth transistor T4 may be connected with each other.

The first electrode S5 and the second electrode D5 of the fifth transistor T5 may be at opposite sides of the channel of the fifth transistor T5. A gate electrode of the fifth transistor T5 may be a part of the light emission control line 153. The channel of the fifth transistor T5 overlaps the gate electrode of the fifth transistor T5.

The first electrode S6 and the second electrode D6 of the sixth transistor T6 may be at opposite sides of the sixth transistor T6. A gate electrode of the sixth transistor T6 may be a part of the light emission control line 153. The channel of the sixth transistor T6 overlaps the gate electrode of the sixth transistor T6.

The first electrode S7 and the second electrode D7 of the seventh transistor T7 may be at opposite sides of the channel of the seventh transistor T7. A gate electrode of the seventh transistor T7 may be a part of the previous scan line 152. The channel of the seventh transistor T7 overlaps the gate electrode of the seventh transistor T7. The second electrode D7 of the seventh transistor T7 may be connected with the first electrode S4 of the fourth transistor T4.

The etching prevention layers 51a, 62a, 63a, 65a, and 69a may be provided at the same layers as the gate electrode 155, the scan line 151, the previous scan line 152, and the light emission control line 153. The etching prevention layers 51a, 62a, 63a, 65a, and 69a may be at locations where contact holes 51, 62, 63, 65, and 69 that overlap the first electrodes and the second electrodes of the semiconductor layer 130 are formed. For example, the etching prevention layers 51a, 62a, 63a, 65a, and 69a overlap an expansion portion SS of the first electrode S1 of the first transistor T1, the second electrode S2 of the second transistor T2, the second electrode S3 of the third transistor T3, the first electrode S4 of the fourth transistor T4, and the second electrode D6 of the sixth transistor T6, and include holes that are vertically aligned with the contact holes 51, 62, 63, 65, and 69, which will be described below.

The second gate insulation layer 142 may be on the first gate conductor, and a second gate conductor that includes a sustain line 126, a first sustain electrode E1, an initialization voltage line 127, and a parasitic capacitor control pattern 79 may be on the second gate insulation layer 142.

An expanded portion of the sustain line 126 forms the first sustain electrode E1 of the storage capacitor Cst, and the gate electrode 155 forms the second sustain electrode E2.

The first gate insulation layer 141 and the second gate insulation layer 142 may be made of a material such as a silicon nitride, a silicon oxide, and an aluminum oxide.

The interlayer insulation layer 160 may be on the second gate conductor. The interlayer insulation layer 160 may be made of a material such as a silicon nitride, a silicon oxide, an aluminum oxide, and the like, or made of an organic insulation material.

The data conductor (that includes a data line 171, a driving voltage line 172, a first data connection member 71, a second data connection member 72, a third data connection member 73, and a fourth data connection member 74) may be on the interlayer insulation layer 160.

The passivation layer 180 may be on the data conductor. The passivation layer 180 may be a planarization layer, and may include an organic insulation material.

An expanded portion of the sustain line 126, which forms the first sustain electrode E1 of the storage capacitor Cst, has an opening 56 that partially overlaps the gate electrode 155.

The second gate insulation layer 142 and the interlayer insulation layer 160 may be at an area that overlaps the opening 56 and include a contact hole 61 that overlaps the gate electrode 155, and the first gate insulation layer 141, the second gate insulation layer 142, and the interlayer insulation layer 160 may have a contact hole 62 that overlaps the second electrode D3 of the third transistor T3. The first data connection member 71 is disposed on the contact hole 61 that overlaps the gate electrode 155 and on the contact hole 62 that overlaps the second electrode D3 of the third transistor T3. Thus, the gate electrode 155 of the first transistor T1 and the second electrode D3 of the third transistor T3 are connected with each other through the first data connection member 71. As previously described, the etching prevention layer 62a having a hole that is vertically aligned with the contact hole 62 that overlaps the second electrode D3 of the third transistor T3 is between the first gate insulation layer 141 and the second gate insulation layer 142.

The first gate insulation layer 141, the second gate insulation layer 142, and the interlayer insulation layer 160 have a contact hole 63 that overlaps the first electrode S2 of the second transistor T2, and the data line 171 may be on the contact hole 63 such that the first electrode S2 of the second transistor T2 is connected with the data line 171 through the contact hole 63. As previously described, the etching prevention layer 63a having a hole that is vertically aligned with the contact hole 63 that is vertically aligned with the first electrode S2 of the second transistor T2 may be between the first gate insulation layer 141 and the second gate insulation layer 142.

The second gate insulation layer 142 and the interlayer insulation layer 160 have a contact hole 64 that overlaps the initialization voltage line 127, the first gate insulation layer 141, the second gate insulation layer 142, and the interlayer insulation layer 160 have a contact hole 65 that overlaps the first electrode S4 of the fourth transistor T4, and the second data connection member 72 may be on the contact hole 65 that overlaps the first electrode S4 of the fourth transistor T4 such that the first electrode S4 of the fourth transistor T4 is connected with the initialization voltage line 127 through the second data connection member 72. As previously described, the etching prevention layer 65a having a hole that is vertically aligned with the contact hole 65 that overlaps the first electrode S4 of the fourth transistor T4 may be between the first gate insulation layer 141 and the second gate insulation layer 142.

The interlayer insulation layer 160 has a contact hole 66 that overlaps the parasitic capacitor control pattern 79, and the driving voltage line 172 is disposed on the contact hole 66 that overlaps the parasitic capacitor control pattern 79 such that the parasitic capacitor control pattern 79 is connected with the driving voltage line 172 through the contact hole 66. As described, the driving voltage line 172 may be connected to the parasitic capacitor control pattern 79 and thus the driving voltage ELVDD, which is a constant DC voltage, is applied to the parasitic capacitor control pattern 79, and accordingly, an image quality characteristic can be prevented from being changed. The parasitic capacitor control pattern 79 may be in an area other than the area shown in the drawing, and may be applied with a voltage other than the driving voltage ELVDD.

The first gate insulation layer 141, the second gate insulation layer 142, and the interlayer insulation layer 160 have a contact hole 67 that overlaps the first electrode S5 of the fifth transistor T5, and the interlayer insulation layer 160 has a contact hole 68 that overlaps the first sustain electrode E1, which is an expanded portion of the sustain line 126. The driving voltage line 172 is connected with the first electrode S5 of the fifth transistor T5 through the contact hole 67, and is simultaneously connected with the first sustain electrode E1 through the contact hole 66. As previously described, the driving voltage line 172 may be connected with the parasitic capacitor control pattern 79 through the contact hole 66. In addition, an etching prevention layer 67a having a hole that is vertically aligned with the contact hole 67 that overlaps the first electrode S5 of the fifth transistor T5 may be between the first gate insulation layer 141 and the second gate insulation layer 142.

The first gate insulation layer 141, the second gate insulation layer 142, and the interlayer insulation layer 160 have a contact hole 69 that overlaps the second electrode D6 of the sixth transistor T6, the third data connection member 73 is disposed on the contact hole 69, the passivation layer 180 has a contact hole 81 that overlaps the third data connection member 73, and a pixel electrode 710 is connected with the third data connection member 73 through the contact hole 81 and is thus connected with the second electrode D6 of the sixth transistor through the third data connection member 73. As previously described, the etching prevention layer 69a having a hole that is vertically aligned with the contact hole 69 that overlaps the second electrode D6 of the sixth transistor T6 is disposed between the first gate insulation layer 141 and the second gate insulation layer 142.

The lower electrode 31 overlaps the first transistor T1 on a plane, the first gate insulation layer 141, the second gate insulation layer 142, and the interlayer insulation layer 160 have the contact hole 51 that overlaps the expansion portion SS of the first electrode S1, the buffer layer 112, the first gate insulation layer 141, the second gate insulation layer 142, and the interlayer insulation layer 160 have a contact hole 52 that overlaps the lower electrode 31, and the fourth data connection member 74 is on the contact hole 51 that overlaps the expansion portion SS of the first electrode S1 of the first transistor T1 and the contact hole 52 that overlaps the lower electrode 31. The first electrode S1 of the first transistor T1 and the lower electrode 31 are connected with each other through the fourth data connection member 74. As previously described, the etching prevention layer 51a having a hole that is vertically aligned with the contact hole 51 that overlaps the expansion portion SS of the first electrode S1 of the first transistor T1 is between the first gate insulation layer 141 and the second gate insulation layer 142.

An organic light emitting diode OLED that includes the pixel electrode 710, an organic emission layer 720, and a common electrode 730 is on the passivation layer 180. In an implementation, a barrier rib may be on a part of the pixel electrode 710 and the passivation layer 180, the barrier rib has an opening that overlaps the pixel electrode 710, the organic emission layer 720 is disposed in the opening of the barrier rib, and the common electrode 730 is disposed on the organic emission layer and the barrier rib.

In an implementation, the pixel electrode may be an anode, which is a hole injection electrode, and the common electrode may be a cathode, which is an electron injection electrode. In an implementation, the pixel electrode may be a cathode and the common electrode may be an anode. A hole and an electron are injected into the organic emission layer from the pixel electrode and the common electrode, respectively, and an exciton generated by coupling the injected hole and electron falls from an excited state to a ground state to emit light.

In an implementation, an encapsulation layer that protects the organic light emitting diode OLED may be on the common electrode 730. The encapsulation layer may contact the common electrode 730 or may be separated from the common electrode 730. The encapsulation layer may be a thin film encapsulation layer formed by stacking an inorganic layer and an organic layer, and may have a three-layered structure of an inorganic layer, an organic layer, and an inorganic layer. A capping layer and a function layer may be provided between the common electrode 730 and the encapsulation layer.

As described, the display device according to the present exemplary embodiment may include etching prevention layers 51a, 62a, 63a, 65a, and 69a that are disposed in areas where contact holes 51, 62, 63, 65, and 69 that overlap parts of the first electrodes S1, S2, S3, S4, S5, S6, and S7 and second electrodes D1, D2, D3, D4, D5, D6, and D7 of the plurality of transistors T1, T2, T3, T4, T5, T6, and T7 of the semiconductor layer 130.

The etching prevention layers 51a, 62a, 63a, 65a, and 69a protect the semiconductor layer 130 by preventing the semiconductor layer 130 from being etched while a contact hole is formed in an insulation layer that is disposed on a second gate conductor. This will be described in detail later.

Next, a method for manufacturing a display device according to an exemplary embodiment will be described with reference to FIG. 6 to FIG. 10, together with FIG. 5. FIG. 6 to FIG. 10 illustrate cross-sectional views of stages in a manufacturing method of a display device according to an exemplary embodiment.

Figure 6:
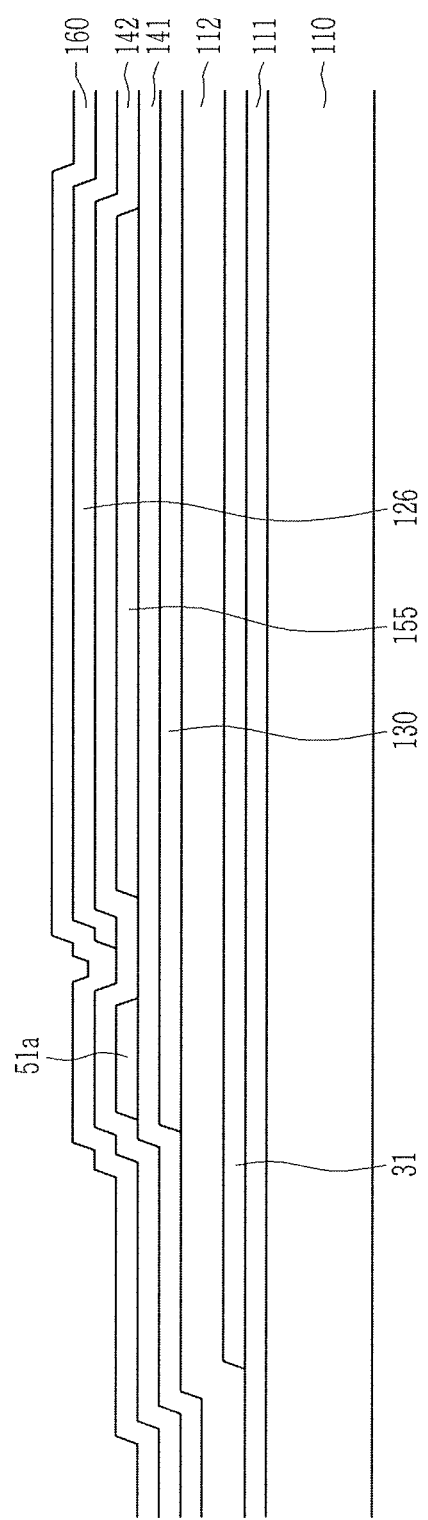
FIG. 6 to FIG. 10 illustrate cross-sectional views of stages in a manufacturing method of a display device according to an exemplary embodiment.

Referring to FIG. 6, a barrier layer 111 may be formed on a substrate 110, a lower electrode 31 may be formed on the barrier layer 111, a buffer layer 112 may be formed on the lower electrode 31, a semiconductor layer 130 may be formed on the buffer layer 112, a first gate insulation layer 141 may be formed on the semiconductor layer 130, a first gate conductor (that includes a gate electrode 155 and an etching prevention layer 51a) may be formed on the first gate insulation layer 141, a second gate insulation layer 142 may be formed on the gate electrode 155 and the etching prevention layer 51a, a second gate conductor (that includes a sustain line 126) may be formed on the second gate insulation layer 142, and an interlayer insulation layer 160 may be formed on the sustain line 162.

In an implementation, the first gate conductor may include molybdenum (Mo), aluminum (Al), or copper (Cu), and the first gate insulation layer 141, the second gate insulation layer 142, and the interlayer insulation layer 160 may include a silicon oxide ($SO_x$) or a silicon nitride ($SN_y$).

Figure 7:
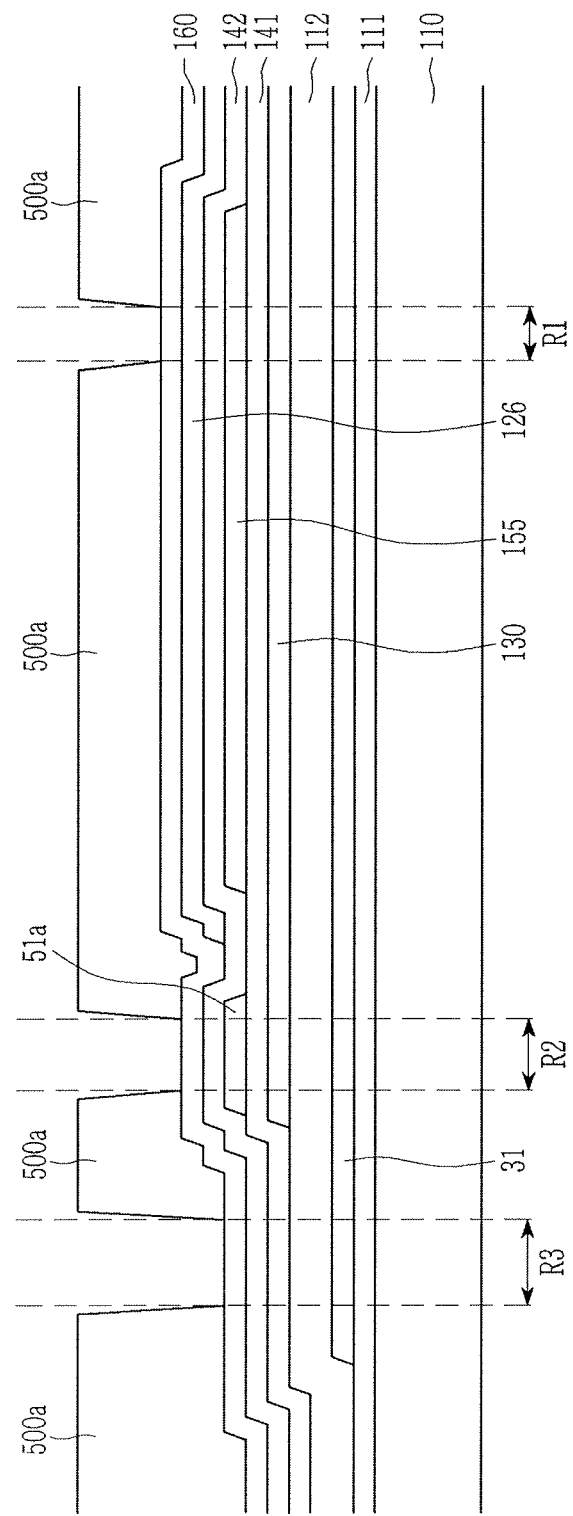

Referring to FIG. 7, a photosensitive film may be deposited on the interlayer insulation layer 160, the photosensitive film may be exposed and developed by using one photomask to form photosensitive film patterns 500a. For example, portions of the photosensitive film may be removed from a first area R1 (where a contact hole 61 that overlaps the sustain line 126 will be formed), a second area R2 (where a contact hole 51 that overlaps an expansion portion SS of a first electrode S1 of a first transistor T1 will be formed), and a third area R3 (where a contact hole 52 that overlaps the lower electrode 31 will be formed).

Figure 8:
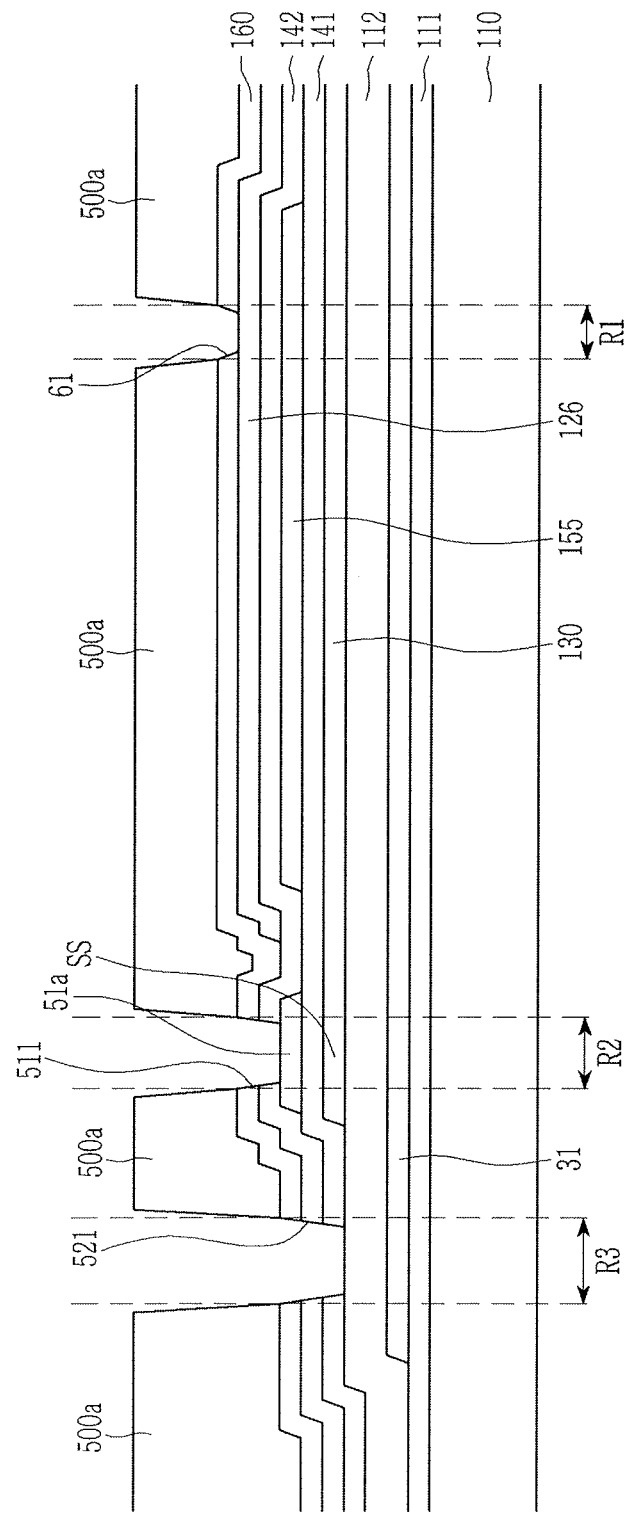

Referring to FIG. 8, the interlayer insulation layer 160 in the first area R1, the interlayer insulation layer 160 and the second gate insulation layer 142 in the second area R2, and the interlayer insulation layer 160, the second gate insulation layer 142, and the first gate insulation layer 141 in the third area R3 may be primary etched by using the photosensitive film patterns 500a as etching masks to form a contact hole 61 that overlaps the sustain line 126 in the first area R1, a first hole 511 in the interlayer insulation layer 160 and the second gate insulation layer 142 in the second area R2, and a second hole 521 in the interlayer insulation layer 160, the second gate insulation layer, and the first gate insulation layer 141 in the third area R3. In this case, the etching prevention layer 51a may protect the expansion portion SS of the first electrode S1 of the first transistor T1, at a location where the contact hole 51 is to be formed, to thereby not be etched. In an implementation, the interlayer insulation layer 160, the second gate insulation layer 142, and the first gate insulation layer 141 may be etched by a mixture gas of sulfur hexafluoride ($SF_6$) and oxygen ($O_2$). In this case, the sustain line 126, which is the second gate conductor that includes aluminum (Al) or copper (Cu), may not be etched. For example, aluminum may be etched by using a chlorine-based gas ($Cl_2$ or $BCl_3$) and may not be etched by the mixture gas of sulfur hexafluoride ($SF_6$) and oxygen ($O_2$), and copper (Cu) may be wet-etched rather than dry-etched, and thus the first gate conductor and the insulation layers 141, 142, and 160 may have a significant etch ratio with the second gate conductor, and accordingly, selective etching may be carried out.

Figure 9:
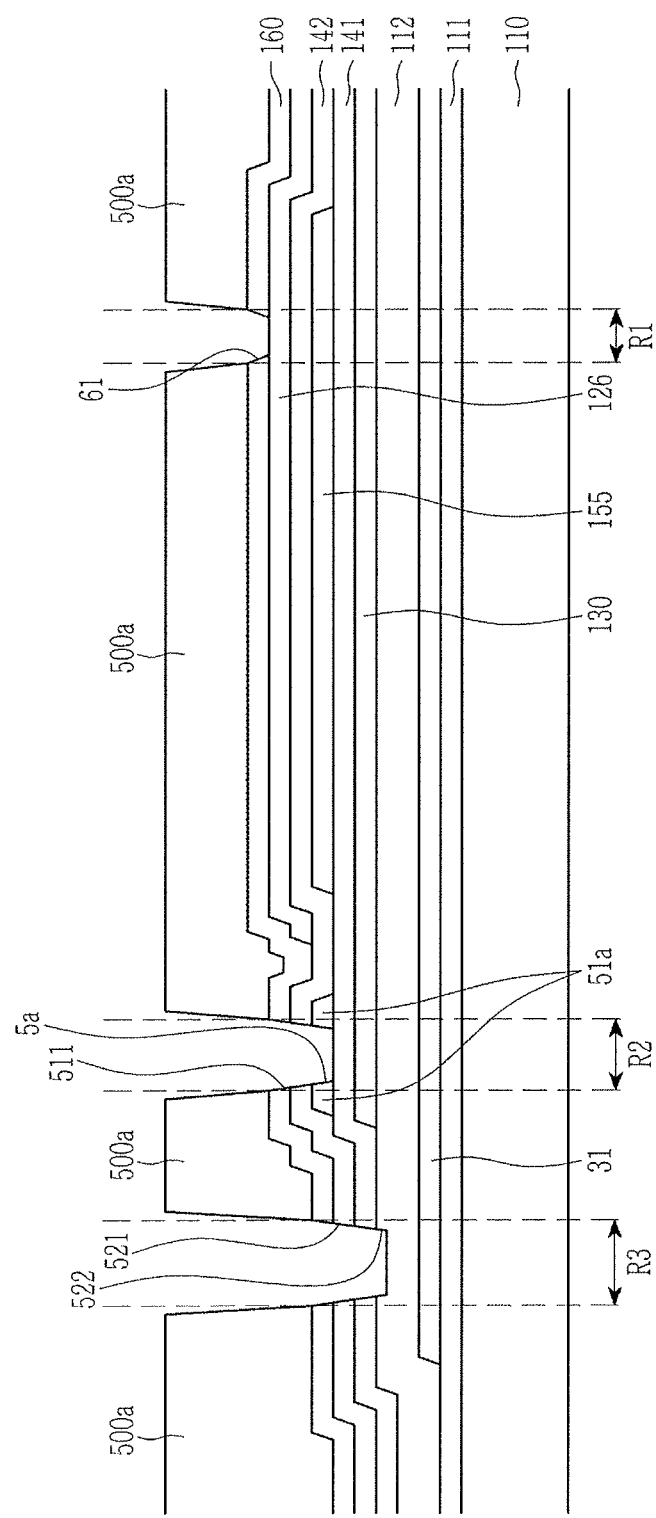

Referring to FIG. 9, secondary etching may be performed by using the photosensitive film patterns 500a as etching masks, and thus the etching prevention layer 51a in the second area R2 may be etched such that a third hole 5a is formed in the etching prevention layer 51a. In this case, the buffer layer 112 in the third area R3 may be partially etched such that a groove 522 may be formed. The etching prevention layer 51a may be etched by the mixture gas of sulfur hexafluoride ($SF_6$) and oxygen ($O_2$) and the etching prevention layer 51a may be etched by the same etching gas, and at the same time, the buffer layer 112 in the third area R3 may be etched together therewith.

Figure 10:
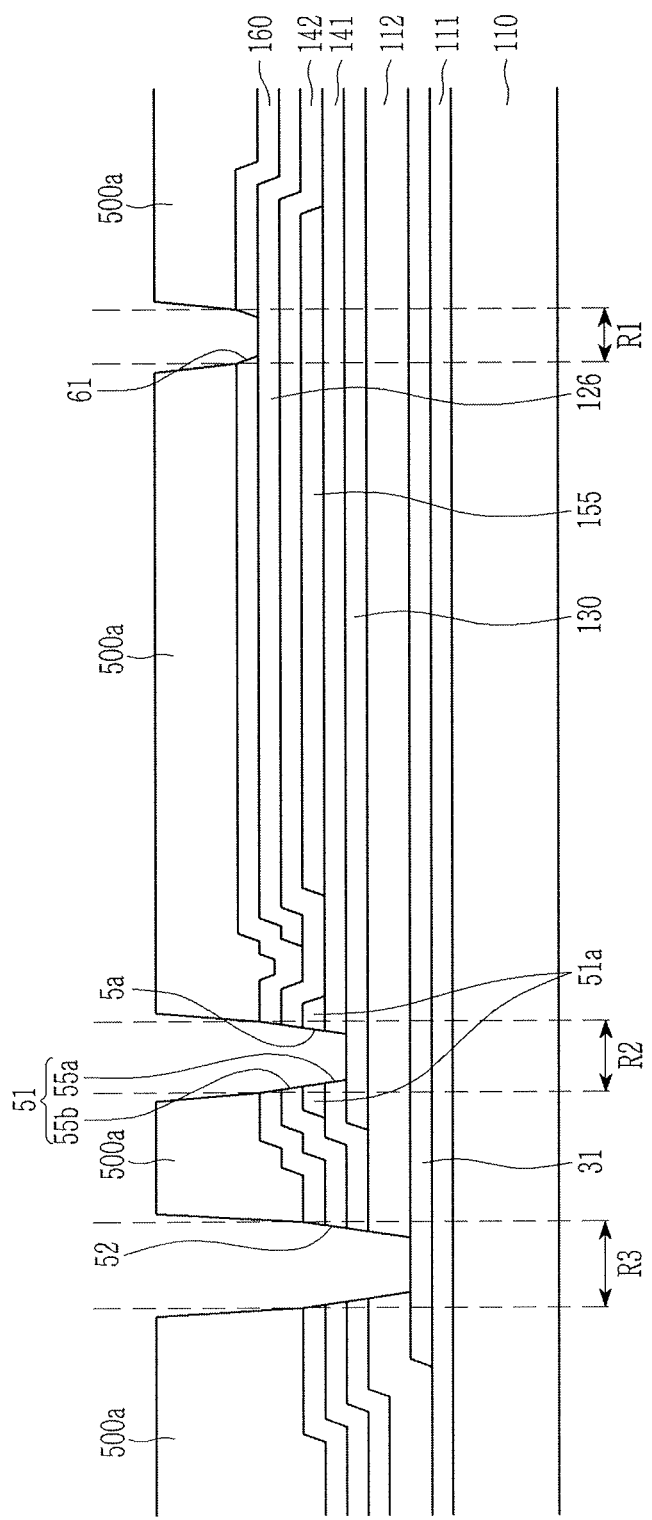

Referring to FIG. 10, tertiary etching may be performed by using the photosensitive film patterns 500a as the etching masks to remove a portion of the first gate insulation layer 141 that overlaps the third hole 5a of the etching prevention layer 51a and the buffer layer 112 of the third area R3 by etching, such that the contact hole 51 that overlaps the expansion portion SS of the first electrode S1 of the first transistor T1 and the contact hole 52 that overlaps the lower electrode 31 are completed. The contact hole 51 that overlaps the expansion portion SS of the first electrode S1 may be vertically aligned with (e.g., may include) the third hole 5a of the etching prevention layer 51a, and the contact hole 51 includes a first sub-contact hole 55a formed the first gate insulation layer 141 that is below the etching prevention layer 51a and a second sub-contact hole 55b formed in the interlayer insulation layer 160 and the second gate insulation layer 142 that are above the etching prevention layer 51a.

Next, the photosensitive film patterns 500a may be removed, a data conductor that includes a data line 171, a driving voltage line 172, a first data connection member 71, a second data connection member 72, a third data connection member 73, and a fourth data connection member 74 on the interlayer insulation layer 160, and a passivation layer 180, a pixel electrode 710, a barrier rib, an organic emission layer 720, and a common electrode 730 may be formed on the data conductor such that the display device of FIG. 5 is completed.

As described, according to the manufacturing method of the display device according to the exemplary embodiment, the etching prevention layers 51a, 62a, 63a, 65a, and 69a are formed at locations where the contact holes 51, 62, 63, 65, and 69 that overlap the first electrodes and the second electrodes of the semiconductor layer 130 are formed. The insulation layers are firstly or primarily etched by using one photomask, the etching prevention layers 51a, 62a, 63a, 65a, and 69a are secondarily etched, and then the insulation layers are thirdly etched such that the contact holes 66 and 68 that overlap the second gate conductor, the contact holes 51, 62, 63, 65, and 69 that overlap the first electrodes and the second electrodes of the semiconductor layer 130, and the contact hole 52 that overlaps the lower electrode 31 can be formed. As described, the contact holes may be formed by using one photomask, and a manufacturing cost may be reduced compared to other cases in which contact holes formed in different insulation layers are formed by using different photomasks, respectively.

As previously described, in the display device and the manufacturing method of the display device according to the exemplary embodiments, the etching prevention layers 51a, 62a, 63a, 65a, and 69a that overlap the expansion portion SS of the first electrode S1 of the first transistor T1, the first electrode S2 of the second transistor T2, the second electrode D3 of the third transistor T3, the first electrode S4 of the fourth transistor T4, and the second electrode D6 of the sixth transistor T6 and vertically aligned with the contact holes 51, 62, 63, 65, and 69, and thus, during a manufacturing process, the semiconductor layer 130 that includes the expansion portion SS of the first electrode S1 of the first transistor T1, the first electrode S2 of the second transistor T2, the second electrode D3 of the third transistor T3, the first electrode S4 of the fourth transistor T4, and the second electrode D6 of the sixth transistor T6, and the contact holes are formed by using one photomask so that a manufacturing cost may be reduced.

Figure 11:
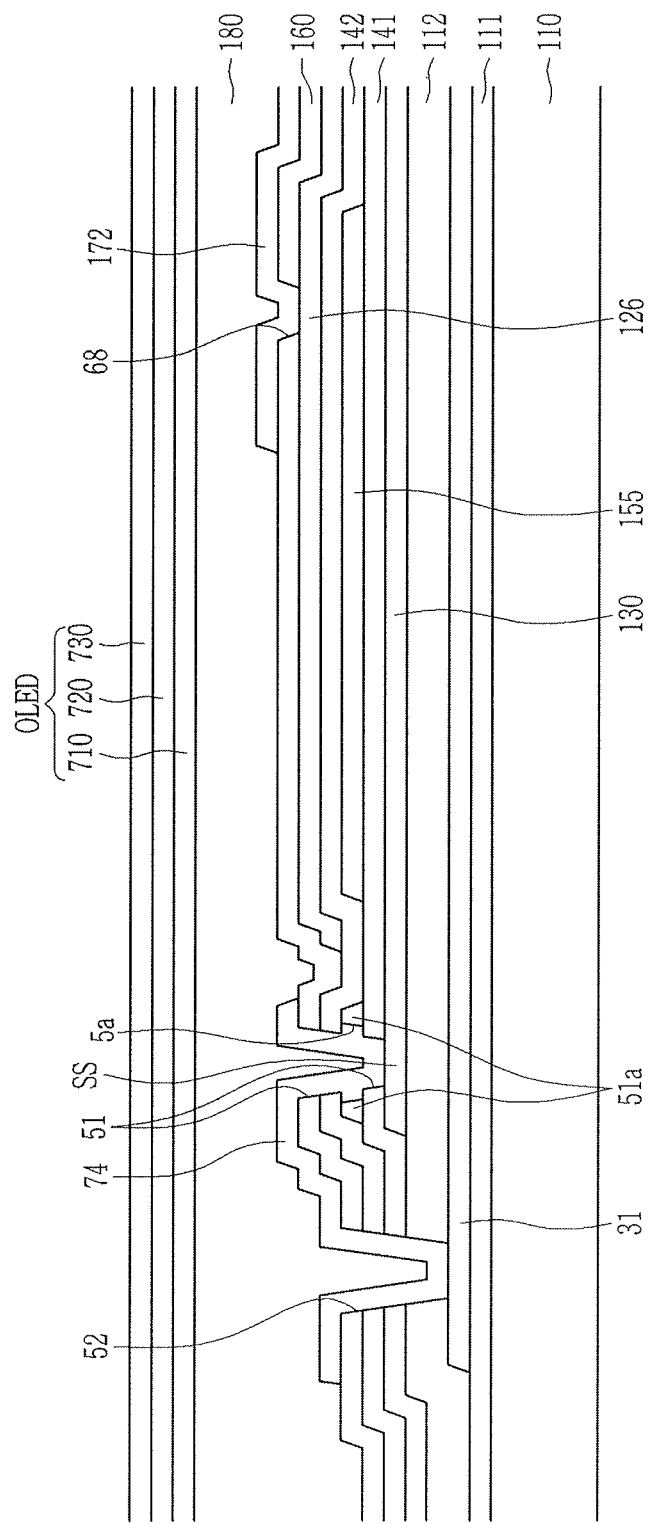
FIG. 11 illustrates a cross-sectional view of a display device according to another exemplary embodiment.
Figure 12:
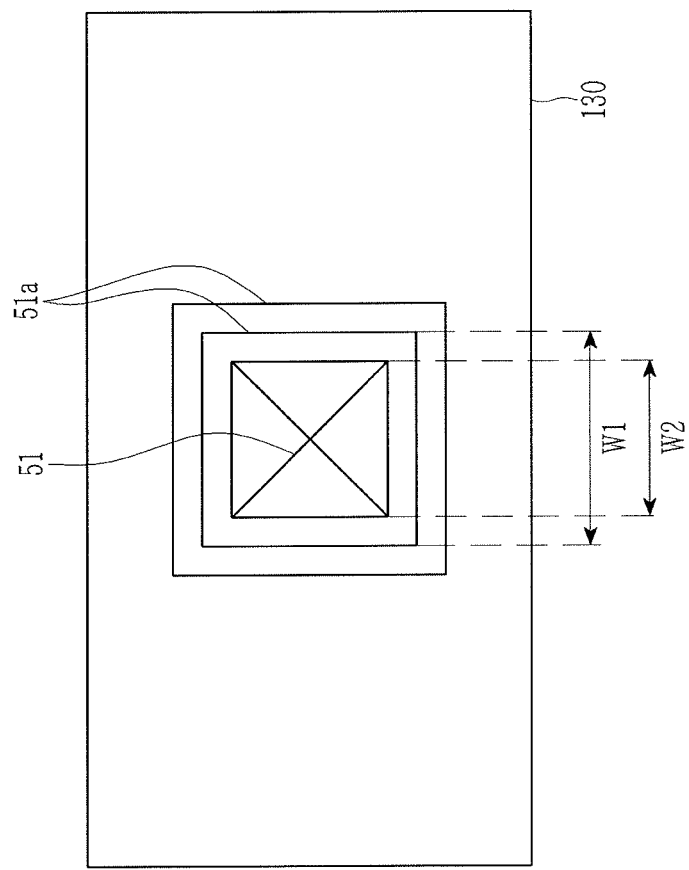
FIG. 12 illustrates a layout view of a part of FIG. 11.
Figure 13:
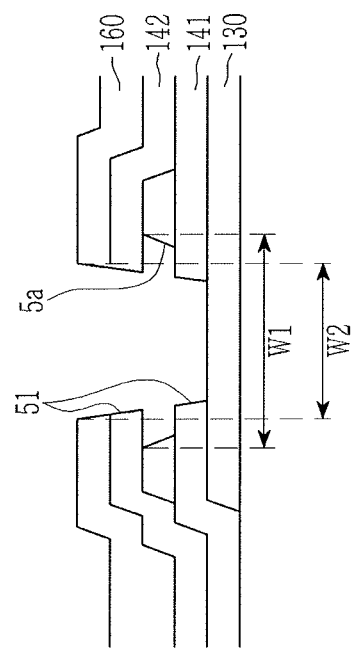
FIG. 13 illustrates a cross-sectional view of a part of FIG. 12.

Next, referring to FIG. 11 to FIG. 13, a display device according to another exemplary embodiment will be described. FIG. 11 illustrates a cross-sectional view of a display device of another exemplary embodiment, FIG. 12 illustrates a plan view of a part of FIG. 11, and FIG. 13 illustrates a sectional view of a part of FIG. 12.

Referring to FIG. 11, a display device according to the present exemplary embodiment is similar to the display device shown in FIG. 5. A detailed description of similar constituent elements may be omitted.

Unlike the display device according to the exemplary embodiment of FIG. 5, in the display device according to the present exemplary embodiment, a hole 5a of an etching prevention layer 51a may have a size that is different from (e.g., smaller or larger than) that of a contact hole 51 formed in insulation layers 141, 142, and 160 that are above and below the etching prevention layer 51a. For example, edges of the hole 5a may be offset from the aligned edges of the contact hole 51.

In FIG. 11, only one etching prevention layer 51a is illustrated, but such a size difference of the hole of the etching prevention layer may be applied to the etching prevention layers 62a, 63a, 65a, and 69a shown in FIG. 4.

Referring to FIG. 12 and FIG. 13, the hole 5a of the etching prevention layer 51a that overlaps a first electrode S1 of a first transistor T1 of a semiconductor layer 130 may have a first width W1, and the contact hole 51 formed in a first gate insulation layer 142 that is on the etching prevention layer 51a and the first gate insulation layer 141 that is below the etching prevention layer 51a may have a second width W2. In an implementation, the first width W1 may be larger than the second width W2.

As described, in the display device according to the exemplary embodiments, the etching prevention layers 51a, 62a, 63a, 65a, and 69a may be included in the areas where the contact holes 51, 62, 63, 65, and 69 that partially overlaps the first electrodes S1, S2, S3, S4, S5, S6, and S7 and the second electrodes D1, D2, D3, D4, D5, D6, and D7 of the plurality of transistors T1, T2, T3, T4, 15, T6, and T7 of the semiconductor layer 130, and thus the etching prevention layers 51a, 62a, 63a. 65a, and 69a protect the semiconductor layer 130 by preventing the semiconductor layer 130 from being etched while the contact holes are formed on the second gate conductor.

The features of the display device according to the above-described exemplary embodiments of FIG. 1 to FIG. 5 are applicable to the display device of the present exemplary embodiment.

Next, a manufacturing method of a display device according to another exemplary embodiment will be described with reference to FIG. 14 to FIG. 17, together with FIG. 11. FIG. 14 to FIG. 17 illustrate cross-sectional views of stages in a manufacturing method of a display device according to another exemplary embodiment.

Figure 14:
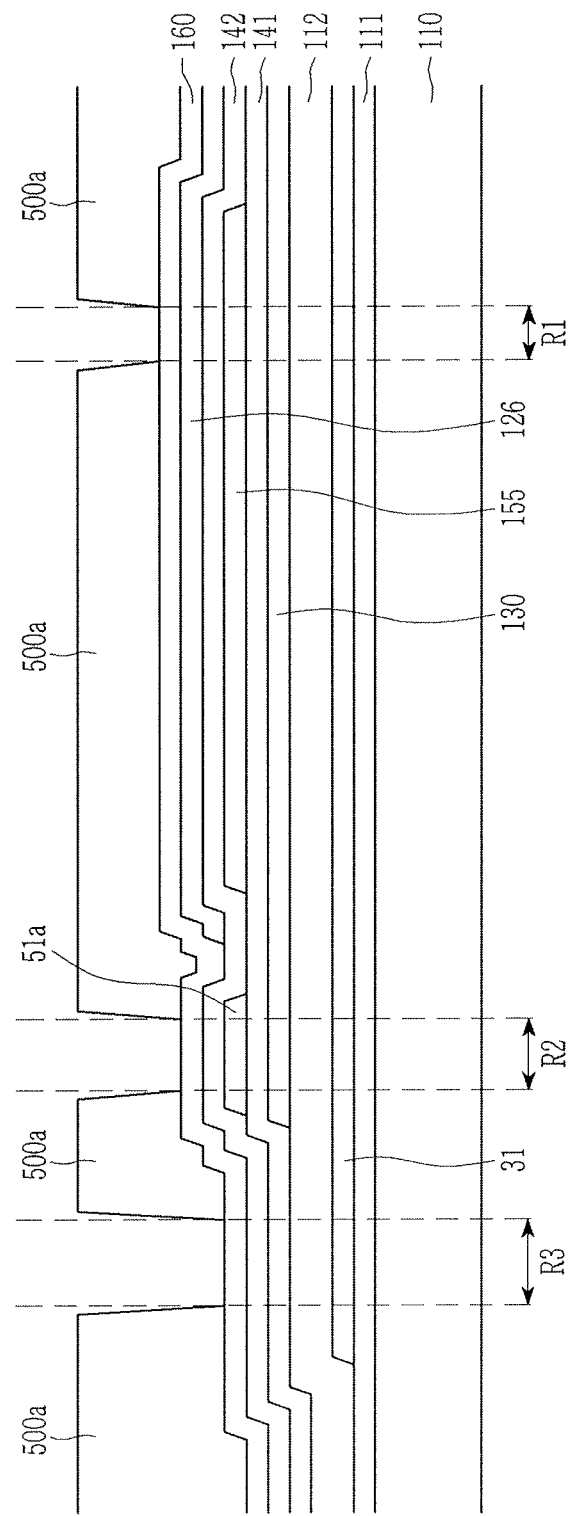
FIG. 14 to FIG. 17 illustrate cross-sectional views of stages in a manufacturing method of a display device according to another exemplary embodiment.

Similar to FIG. 6 and FIG. 7, as shown in FIG. 14, a barrier layer 111 may be formed on a substrate 110, a lower electrode 31 may be formed on the barrier layer 111, a buffer layer 112 may be formed on the lower electrode 31, a semiconductor layer 130 may be formed on the buffer layer 112, a first gate insulation layer 141 may be formed on the semiconductor layer 130, a first gate conductor (that includes a gate electrode 155 and an etching prevention layer 51a) may be formed on the first gate insulation layer 141, a second gate conductor (that includes a sustain line 126) may be formed on the gate electrode 155 and the etching prevention layer 51a, an interlayer insulation layer 160 may be formed on the sustain line 126, and a photosensitive film may be deposited on the interlayer insulation layer 160, and the photosensitive film may be exposed and developed by using one photomask such that a photosensitive film patterns 500a are formed by removing a portion of the photosensitive film that is in a first area R1 (where a contact hole 61 that overlaps the sustain line 126 will be formed), a second area R2 (where a contact hole 51 that overlaps an expansion portion SS of a first electrode S1 of a first transistor T1 will be formed), and a third area R3 (where a contact hole 52 that overlaps the lower electrode 31 will be formed).

Figure 15:
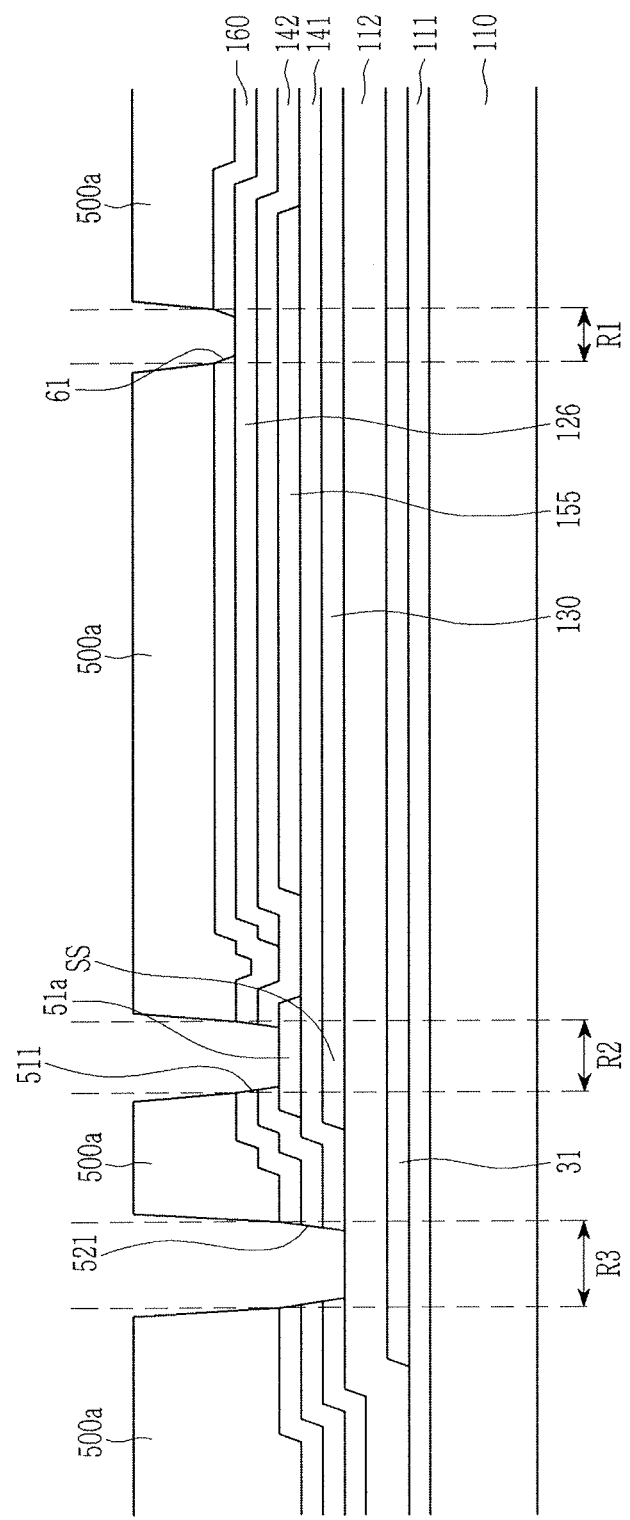

Similar to FIG. 8, as shown in FIG. 15, the interlayer insulation layer 160 in the first area R1, the interlayer insulation layer 160 and the second gate insulation layer 142 in the second area R2, the interlayer insulation layer 160, the second gate insulation layer 142, and the first gate insulation layer 141 in the third area R3 may be primary etched by using the photosensitive film patterns 500a as etching masks to form a contact hole 61 that overlaps the sustain line 126 in the first area R1, a first hole 511 in the interlayer insulation layer 160 and the second gate insulation layer 142 in the second area R2, and a second hole 521 in the interlayer insulation layer 160, the second gate insulation layer, and the first gate insulation layer 141 in the third area R3.

Figure 16:
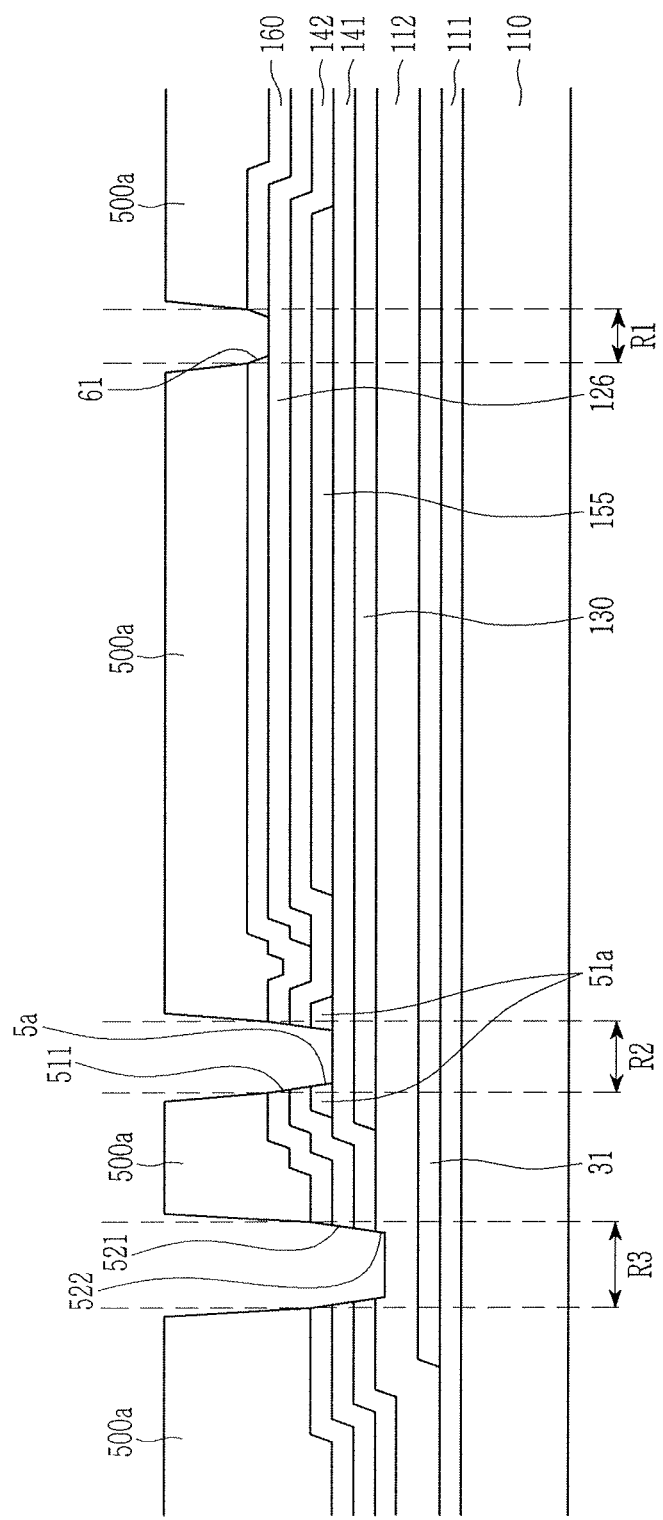

Similar to FIG. 9, as shown in FIG. 16, secondary etching may be performed by using the photosensitive film patterns 500a as etching masks, and thus the etching prevention layer 51a in the second area R2 may be etched such that a third hole 5a may be formed in the etching prevention layer 51a.

Figure 17:
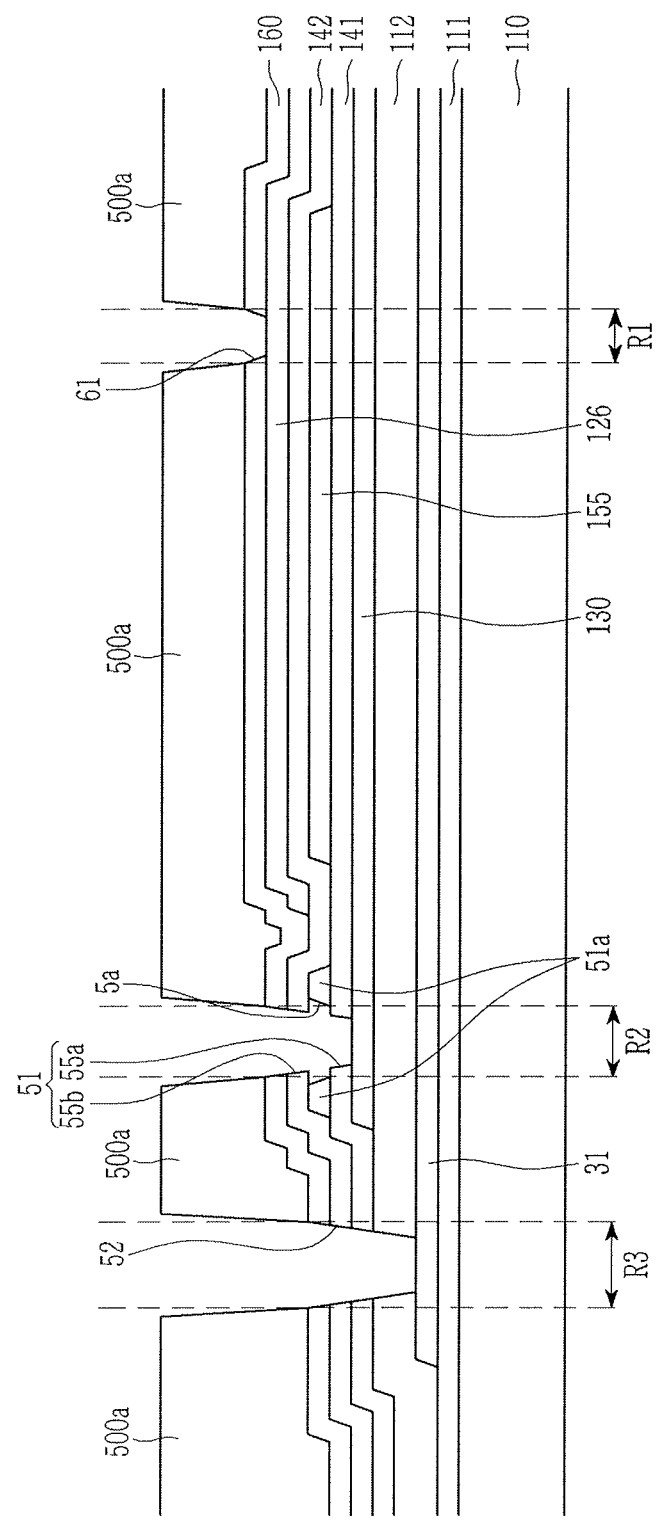

Referring to FIG. 17, tertiary etching may be performed by using the photosensitive film patterns 500a as the etching masks to remove the first gate insulation layer 141 that overlaps the third hole 5a of the etching prevention layer 51a and the buffer layer 112 of the third area R3 by etching such that the contact hole 51 that overlaps the expansion portion SS of the first electrode S1 of the first transistor T1 and the contact hole 52 that overlaps the lower electrode 31 are completed. In this case, the etching prevention layer 51a may be partially etched together therewith such that a size of the hole 5a of the etching prevention layer 51a becomes larger (e.g., wider) than a size (e.g., width) of the contact hole 51. The contact hole 51 that overlaps the expansion portion SS of the first electrode S1 may be vertically aligned with the third hole 5a of the etching prevention layer 51a, but the size of the hole 5a of the etching prevention layer 51a may be larger than that of the contact hole 51. The contact hole 51 may include a first sub-contact hole 55a formed in the first gate insulation layer 141 that is below the etching prevention layer 51a and a second sub-contact hole 55b formed in the interlayer insulation layer 160 and the second gate insulation layer 142 that are above the etching prevention layer 51a.

Next, the photosensitive film patterns 500a may be removed, a data conductor that includes a data line 171, a driving voltage line 172, a first data connection member 71, a second data connection member 72, a third data connection member 73, and a fourth data connection member 74 on the interlayer insulation layer 160, and a passivation layer 180, a pixel electrode, a barrier rib, an organic emission layer 720, and a common electrode 730 may be formed on the data conductor such that the display device of FIG. 11 is completed.

As described, according to the manufacturing method of the display device according to the exemplary embodiment, the etching prevention layers 51a, 62a, 63a, 65a, and 69a may be formed at locations where the contact holes 51, 62, 63, 65, and 69 that overlap the first electrodes and the second electrodes of the semiconductor layer 130 are formed, the insulation layers are firstly etched by using one photomask, the etching prevention layers 51a, 62a, 63a, 65a, and 69a may be secondarily etched, and then the insulation layers are thirdly etched such that the contact holes 66 and 68 that overlap the second gate conductor, the contact holes 51, 62, 63, 55, and 69 that overlap the first electrodes and the second electrodes of the semiconductor layer 130, and the contact hole 52 that overlaps the lower electrode 31 may be formed. As described, the contact holes may be formed by using one photomask, and a manufacturing cost may be saved compared to other cases in which contact holes formed in different insulation layers are formed by using different photomasks, respectively.

As previously described, in the display device and the manufacturing method of the display device according to the exemplary embodiments, the etching prevention layers 51a, 62a, 63a, 65a, and 69a that overlap the expansion portion SS of the first electrode S1 of the first transistor T1, the first electrode S2 of the second transistor T2, the second electrode D3 of the third transistor T3, the first electrode S4 of the fourth transistor T4, and the second electrode D6 of the sixth transistor T6 and vertically aligned with the contact holes 51, 62, 63, 65, and 69, and thus, during a manufacturing process, the semiconductor layer 130 that includes the expansion portion SS of the first electrode S1 of the first transistor T1, the first electrode S2 of the second transistor T2, the second electrode D3 of the third transistor T3, the first electrode S4 of the fourth transistor T4, and the second electrode D6 of the sixth transistor T6, and the contact holes are formed by using one photomask so that a manufacturing cost can be saved.

By way of summation and review, the organic light emitting diode display may include a substrate, a plurality of thin film transistors that are disposed on the substrate, a plurality of insulation layers disposed between wires that form the third film transistors, and an organic light emitting element connected to the thin film transistor.

In order to form wires and holes for connection of the wires in the organic light emitting diode display, photolithography processes may be performed. As a number of photomasks is increased, a manufacturing cost may also increase.

The embodiments may provide a display device that may help prevent an increase of manufacturing costs by reducing the number of photomasks when a plurality of contact holes are formed in a plurality of insulation layers.

According to the exemplary embodiments, the number of photo masks used during a manufacturing process may be reduced since a plurality of contact holes are formed in different insulation layers by using one photomask, and accordingly, an increase of manufacturing costs can be prevented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
   a substrate;
   a lower electrode on the substrate;
   a semiconductor layer on the lower electrode;
   a gate electrode and an etching prevention layer that overlap the semiconductor layer;
   a first conductor on the gate electrode;
   a second conductor on the first conductor;
   a light emission element that is electrically connected with the second conductor; and
   a first insulation layer between the semiconductor layer and the gate electrode and between the semiconductor layer and the etching prevention layer,
   wherein:
   the first insulation layer includes a first sub-contact hole that overlaps the semiconductor layer,
   the etching prevention layer includes a hole that is vertically aligned with the first sub-contact hole, and
   the etching prevention layer is spaced from the gate electrode without contacting the gate electrode.

2. The display device as claimed in claim 1, further comprising a second insulation layer between the gate electrode and the etching prevention layer, and between the gate electrode and the second conductor, the second insulation layer including a second sub-contact hole that overlaps the semiconductor layer,
   wherein the hole of the etching prevention layer is vertically aligned with the second sub-contact hole of the second insulation layer.

3. The display device as claimed in claim 2, further comprising:

a third insulation layer between the first conductor and the second conductor; and
a fourth insulation layer between the lower electrode and the semiconductor layer, wherein:
the third insulation layer includes a second contact hole that overlaps the first conductor, and
the first insulation layer, the second insulation layer, the third insulation layer, and the fourth insulation layer collectively include a third contact hole that overlaps the lower electrode.

4. The display device as claimed in claim 3, wherein the lower electrode and the semiconductor layer are electrically connected with each other.

5. The display device as claimed in claim 1, wherein the hole in the etching prevention layer has a width that is larger than a width of the first sub-contact hole of the first insulation layer.

6. The display device as claimed in claim 5, further comprising a second insulation layer between the gate electrode and the etching prevention layer, and between the gate electrode and the second conductor, the second insulation layer including a second sub-contact hole that overlaps the semiconductor layer, wherein:
the hole in the etching prevention layer is vertically aligned with the second sub-contact hole of the second insulation layer, and
the width of the hole in the etching prevention layer is larger than a width of the second sub-contact hole of the second insulation layer.

7. The display device as claimed in claim 6, further comprising:
a third insulation layer between the first conductor and the second conductor; and
a fourth insulation layer between the lower electrode and the semiconductor layer,
wherein:
the third insulation layer includes a second contact hole that overlaps the first conductor, and
the first insulation layer, the second insulation layer, the third insulation layer, and the fourth insulation layer collectively include a third contact hole that overlaps the lower electrode.

8. The display device as claimed in claim 7, wherein the lower electrode and the semiconductor layer are electrically connected with each other.

9. A display device, comprising:
a substrate;
a lower electrode on the substrate;
a first insulation layer on the lower electrode;
a semiconductor layer on the first insulation layer, the semiconductor layer overlapping the lower electrode;
a second insulation layer on the semiconductor layer;
a gate electrode and an etching prevention layer on the second insulation layer, the gate electrode and the etching prevention layer overlapping the semiconductor layer;
a third insulation layer on the gate electrode and the etching prevention layer;
a first conductor on the third insulation layer, the first conductor overlapping the gate electrode;
a fourth insulation layer on the first conductor;
a signal transmitting layer on the fourth insulation layer, the signal transmitting layer overlapping the first conductor;
a connection member on the fourth insulation layer, the connection member overlapping the lower electrode and the semiconductor layer;
a fifth insulation layer on the signal transmitting layer and the connection member; and
a light emission element on the fifth insulation layer, wherein:
the fourth insulation layer includes a first contact hole that overlaps the first conductor,
the second insulation layer, the third insulation layer, and the fourth insulation layer include a second contact hole that overlaps the semiconductor layer,
the etching prevention layer includes a hole that is vertically aligned with the second contact hole, and
the first insulation layer, the second insulation layer, the third insulation layer, and the fourth insulation layer include a third contact hole that overlaps the lower electrode.

10. The display device as claimed in claim 9, wherein:
the signal transmitting layer is on the first contact hole and is connected with the first conductor,
the connection member is on the second contact hole and the third contact hole, and
the semiconductor layer and the lower electrode are connected with each other through the connection member.

11. A method for manufacturing a display device, the method comprising:
forming a lower electrode on a substrate;
depositing a first insulation layer on the lower electrode;
forming a semiconductor layer that overlaps the lower electrode on the first insulation layer;
depositing a second insulation layer on the semiconductor layer;
forming a gate electrode and an etching prevention layer that overlap the semiconductor layer on the second insulation layer, the etching prevention layer being spaced from the gate electrode without contacting the gate electrode;
depositing a third insulation layer on the gate electrode and the etching prevention layer;
forming a first conductor that overlaps the gate electrode on the third insulation layer;
depositing a fourth insulation layer on the first conductor;
forming a photosensitive film patterns on the fourth insulation layer by depositing a photosensitive film and exposing and developing the photosensitive film such that portions of the photosensitive film are removed in a first area, a second area, and a third area;
primary etching the third insulation layer by using the photosensitive film patterns as an etching mask;
secondary etching the etching prevention layer by using the photosensitive film patterns as an etching mask; and
tertiary etching the first insulation layer by using the photosensitive film patterns as an etching mask.

12. The method for manufacturing the display device as claimed in claim 11, wherein
the first area is an area that overlaps the first conductor,
the second area is an area that overlaps the semiconductor layer, and
the third area is an area that overlaps the lower electrode.

13. The method for manufacturing the display device as claimed in claim 12, wherein, in the primary etching,
the third insulation layer in the first area is etched and a first contact hole is formed,
the fourth insulation layer and the third insulation layer that are in the second area are etched and a first sub-contact hole is formed, and the fourth insulation layer, the third insulation layer, and the second insulation layer that are in the third area are etched.

14. The method for manufacturing the display device as claimed in claim 13, wherein, in the secondary etching,
   a hole is formed in the etching prevention layer, and
   the hole of the etching prevention layer is vertically aligned with the fourth insulation layer and the first sub-contact hole of the third insulation layer that are in the second area.

15. The method for manufacturing the display device as claimed in claim 14, wherein, in the secondary etching, the first insulation layer in the third area is partially etched and a groove is formed in the first insulation layer.

16. The method for manufacturing the display device as claimed in claim 14, wherein, in the tertiary etching,
   the second insulation layer that is in the second area is etched and a second sub-contact hole is formed,
   a second contact hole formed of the first sub-contact hole and the second sub-contact hole is formed, and
   the first insulation layer that is in the third area is etched and a third contact hole is formed.

17. The method for manufacturing the display device as claimed in claim 16, wherein the second sub-contact hole is vertically aligned with the hole in the etching prevention layer.

18. The method for manufacturing the display device as claimed in claim 17, further comprising:
   forming a signal transmitting layer on the first contact hole, and
   forming a connection member on the second contact hole and the third contact hole.

19. The method for manufacturing the display device as claimed in claim 16, wherein, in the tertiary etching, the etching prevention layer is partially etched and the hole of the etching prevention layer is widened.

20. The method for manufacturing the display device as claimed in claim 16, further comprising:
   forming a signal transmitting layer on the first contact hole, and
   forming a connection member on the second contact hole and the third contact hole.

21. The display device as claimed in claim 9, wherein:
   the gate electrode and the etching prevention layer comprise a same layer.

\* \* \* \* \*